(12) United States Patent
Li et al.

(10) Patent No.: US 12,660,434 B2
(45) Date of Patent: Jun. 16, 2026

(54) DISPLAY PANEL WITH NARROW FRAME, AND METHOD FOR MANUFACTURING SAME

(71) Applicants: Chengdu BOE Optoelectronics Technology Co., Ltd., Chengdu (CN); BOE Technology Group Co., Ltd., Beijing (CN)

(72) Inventors: Meng Li, Beijing (CN); Binyan Wang, Beijing (CN); Tianyi Cheng, Beijing (CN); Feng Wei, Beijing (CN); Cong Liu, Beijing (CN); Kaipeng Sun, Beijing (CN); Shiqian Dai, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 990 days.

(21) Appl. No.: 17/641,484

(22) PCT Filed: Mar. 30, 2021

(86) PCT No.: PCT/CN2021/084125
§ 371 (c)(1),
(2) Date: Mar. 9, 2022

(87) PCT Pub. No.: WO2022/204995
PCT Pub. Date: Oct. 6, 2022

(65) Prior Publication Data
US 2024/0049532 A1 Feb. 8, 2024

(51) Int. Cl.
*H10K 59/131* (2023.01)
*H10K 59/12* (2023.01)
*H10K 59/123* (2023.01)

(52) U.S. Cl.
CPC ....... *H10K 59/131* (2023.02); *H10K 59/1201* (2023.02); *H10K 59/123* (2023.02)

(58) Field of Classification Search
CPC ............. H10K 59/131; H10K 59/1201; H10K 59/123; H10K 59/124
See application file for complete search history.

(56) References Cited

U.S. PATENT DOCUMENTS

| 10,297,652 B2 * | 5/2019 | Kim | ........................ H10K 59/35 |
| 10,936,842 B2 * | 3/2021 | Gao | ................... G06V 40/1318 |

(Continued)

FOREIGN PATENT DOCUMENTS

| CN | 102569675 A | 7/2012 |
| CN | 107527551 A | 12/2017 |

(Continued)

OTHER PUBLICATIONS

First office action of German application No. 112021001355.6 issued on Aug. 8, 2025.

*Primary Examiner* — Caleb E Henry
*Assistant Examiner* — Pratiksha Jayant Lohakare
(74) *Attorney, Agent, or Firm* — Lippes Mathias LLP

(57) ABSTRACT

Provided is a display panel, including: a base substrate, including a display area and a peripheral area surrounding the display area; a plurality of pixel units, disposed in the display area; a barrier structure, disposed in the peripheral area; at least one first power line, disposed in the peripheral area; and, a row drive circuit, disposed in the peripheral area, wherein orthographic projections of any two of the following structures on the base substrate are at least partially overlapped with each other: the barrier structure, the at least one first power line, and the row drive circuit.

19 Claims, 18 Drawing Sheets

(56)     References Cited

U.S. PATENT DOCUMENTS

| | | | | |
|---|---|---|---|---|
| 11,309,363 | B2 * | 4/2022 | Zhao | H10K 59/60 |
| 11,462,587 | B2 * | 10/2022 | Tang | H10K 59/35 |
| 12,317,699 | B2 * | 5/2025 | He | H10K 59/13 |
| 12,356,822 | B2 * | 7/2025 | Wu | H10K 50/11 |
| 2011/0304604 | A1 * | 12/2011 | Jo | G09G 5/00 |
| | | | | 345/212 |
| 2012/0162053 | A1 | 6/2012 | Lee et al. | |
| 2016/0043346 | A1 * | 2/2016 | Kamiya | H10K 59/8722 |
| | | | | 257/40 |
| 2017/0365814 | A1 | 12/2017 | Kim et al. | |
| 2018/0013092 | A1 | 1/2018 | Park | |
| 2018/0205037 | A1 * | 7/2018 | Kim | H10K 59/131 |
| 2019/0013378 | A1 * | 1/2019 | Wang | H10K 59/126 |
| 2019/0229169 | A1 * | 7/2019 | Huang | H10K 59/1213 |
| 2019/0348491 | A1 | 11/2019 | Chung et al. | |
| 2021/0066418 | A1 | 3/2021 | Seo et al. | |
| 2021/0090514 | A1 | 3/2021 | Wu et al. | |
| 2021/0135149 | A1 * | 5/2021 | Xin | H10K 59/1315 |
| 2021/0225992 | A1 | 7/2021 | Long et al. | |
| 2021/0225994 | A1 | 7/2021 | Long et al. | |

FOREIGN PATENT DOCUMENTS

| | | | | | |
|---|---|---|---|---|---|
| CN | 108878480 | A | 11/2018 | | |
| CN | 110851024 | A | 2/2020 | | |
| WO | 2021017011 | A1 | 2/2021 | | |
| WO | WO-2021017012 | A1 * | 2/2021 | | H01L 27/326 |

* cited by examiner

106

106

107

1

DISPLAY PANEL WITH NARROW FRAME, AND METHOD FOR MANUFACTURING SAME

CROSS-REFERENCE TO RELATED APPLICATION

This application is a 371 of PCT application No, PCT/CN/2021/084125, filed on Mar. 30, 2021, the disclosure of which is incorporated herein by reference in its entirety.

TECHNICAL FIELD

The present disclosure relates to the field of display technologies, and in par relates to a display panel, a method for manufacturing same, and a display device.

BACKGROUND

A display panel generally includes a display area and a peripheral area surrounding the display area. The display panel includes a plurality of pixel units disposed in the display area, a drive circuit disposed in the peripheral area and configured to provide a drive signal for the pixel units, and a power trace disposed in the peripheral area and configured to provide a negative power signal for a cathode layer of the display panel, wherein the power trace is commonly referred to as a VSS trace.

SUMMARY

Embodiments of the present disclosure provide a display panel, a method for manufacturing same, and a display device. The technical solutions are as follows.

According to one aspect of the embodiments of the present disclosure, a display panel is provided. The display panel includes:

a base substrate, including a display area and a peripheral area surrounding the display area;

a plurality of pixel units, disposed in the display area;

a barrier structure, disposed in the peripheral area;

at least one first power line, disposed in the peripheral area and including a first part and a second part, wherein the first part is disposed on a side of the barrier structure distal from the plurality of pixel units and is configured to receive a first power signal, and the second part is electrically connected to the first part and first electrode layers in the plurality of pixel units respectively; and a row drive circuit, disposed in the peripheral area, electrically connected to the plurality of pixel units and configured to provide a drive signal for the plurality of pixel units, wherein orthographic projections of any two of the following structures on the base substrate are at least partially overlapped with each other: the barrier structure, the at least one first power line, and the row drive circuit.

In some embodiments, the peripheral area includes: a first area and a second area which are opposite and parallel to each other, and a third area and a fourth area which are opposite and parallel to each other, wherein an extension direction of the first area is perpendicular to an extension direction of the third area; and the first part is disposed in the first area, and the second part is disposed in the second area, the third area and the fourth area.

In some embodiments, the row drive circuit includes a first drive sub-circuit and a second drive sub-circuit, wherein the first drive sub-circuit is disposed in the third area, and the second drive sub-circuit is disposed in the fourth area.

In some embodiments, both the first drive sub-circuit and the second drive sub-circuit include: a light-emitting control drive circuit, a first-type drive circuit and a second-type drive circuit, wherein the light-emitting control drive circuit is configured to provide a light-emitting control signal, and both the first-type drive circuit and the second-type drive circuit is configured to provide a scanning signal; and an orthographic projection of the first power line on the base substrate is at least partially overlapped with an orthographic projection of the light-emitting control drive circuit on the base substrate, and an orthographic projection of the barrier structure on the base substrate is at least partially overlapped with the orthographic projection of the light-emitting control drive circuit on the base substrate.

In some embodiments, the barrier structure includes a first barrier dam and a second barrier dam;

wherein the first barrier dam is proximal to the plurality of pixel units relative to the second barrier dam, and a thickness of the first barrier dam is less than a thickness of the second barrier dam.

In some embodiments, the first barrier dam includes a first pattern and a second pattern sequentially laminated in a direction going away from the base substrate; and the second barrier dam includes a third pattern, a fourth pattern, and a fifth pattern sequentially laminated in a direction going away from the base substrate;

wherein the first pattern and the fourth pattern are disposed in a pixel define layer of the display panel, the second pattern and the fifth pattern are disposed in a support layer of the display panel, and the third pattern is disposed in a first planarization layer of the display panel.

In some embodiments, the first power line includes two first parts and one second part;

wherein the two first parts are symmetrically disposed about an axis of the base substrate, one end of the second part is connected to one of the two first parts, and the other end of the second part is connected to the other of the two first parts, wherein the axis is parallel to a column direction of the plurality of pixel units.

In some embodiments, the display panel further includes at least one second power line disposed in the peripheral area;

wherein one end of the at least one second power line is disposed on a side of the barrier structure distal from the plurality of pixel units, and is configured to receive a second power signal, and the other end of the at least one second power line is disposed on a side of the barrier structure proximal to the plurality of pixel units, and is electrically connected to the plurality of pixel units;

wherein an orthographic projection of the at least one second power line on the base substrate is at least partially overlapped with the orthographic projection of the barrier structure on the base substrate.

In some embodiments, the second power line includes a third part, two fourth parts, a fifth part, and two sixth parts, wherein the third part is disposed on a side of the barrier structure proximal to the plurality of pixel units and electrically connected to the plurality of pixel units, the two fourth parts are disposed on a side of the third part distal from the plurality of pixel units and electrically connected to the third part, the fifth part is disposed on a side of the two fourth parts distal from the plurality of pixel units and electrically connected to the two fourth parts, and the two sixth parts are disposed on a side of the barrier structure distal from the plurality of pixel units, are configured to receive the second power signals, and are electrically connected to the fifth part;

wherein the two fourth parts are symmetrically disposed about the axis of the base substrate, the two sixth parts are symmetrically disposed about the axis of the base substrate, and the axis is parallel to the column direction of the plurality of pixel units.

In some embodiments, the first power line includes two first parts symmetrically disposed about the axis; and a distance between the sixth part and the first part on a same side of the axis is less than a distance between the sixth part and the axis.

In some embodiments, both the third part and the fifth part extend along a row direction, and the two fourth parts and the two sixth parts extend along a column direction.

In some embodiments, an orthographic projection of each of the fourth parts on the base substrate is at least partially overlapped with the orthographic projection of the barrier structure on the base substrate.

In some embodiments, each of the plurality of pixel units includes a thin film transistor and a light-emitting unit sequentially laminated in a direction going away from the base substrate;

the thin film transistor includes a first buffer layer, a first active pattern, a first gate insulation layer, a first gate pattern, a second gate insulation layer, a second buffer layer, an interlayer dielectric layer, and a source-drain electrode which are sequentially laminated in a direction going away from the base substrate, wherein the source-drain electrode includes a source electrode and a drain electrode which are spaced apart from each other, and are both electrically connected to the first active pattern; and the light-emitting unit includes an electrode pattern, a light-emitting pattern, and the first electrode layer which are sequentially laminated in a direction going away from the base substrate, wherein the electrode pattern is disposed in the second electrode layer and connected to the drain electrode.

In some embodiments, the row drive circuit includes the first buffer layer, a second active pattern, the first gate insulation layer, a second gate pattern, the second gate insulation layer, a third gate pattern, the second buffer layer, the interlayer dielectric layer, and a connection layer which are sequentially laminated in a direction going away from the base substrate, and the connection layer is electrically connected to the first gate pattern;

wherein the first active pattern and the second active pattern are disposed in a same layer, the first gate pattern and the second gate pattern are disposed in a same layer, and the source-drain electrode and the connection layer are disposed in a same layer.

In some embodiments, the display panel further includes: a passivation layer, a first planarization layer and a second planarization layer, wherein the passivation layer is disposed on a side of the source-drain electrode distal from the base substrate, the second planarization layer is disposed on a side of the passivation layer distal from the base substrate, the at least one first power line is disposed on a side of the second planarization layer distal from the base substrate, and the first planarization layer is disposed on a side of the at least one first power line distal from the base substrate.

In some embodiments, a target part of the at least one first power line is provided with at least one opening;

wherein an orthographic projection of the target part on the base substrate is overlapped with the orthographic projection of the barrier structure on the base substrate.

In some embodiments, the display panel further includes a power drive circuit disposed in the peripheral area and on a side of the first part distal from the barrier structure;

wherein the power drive circuit is electrically connected to the first part and configured to provide the first power signal for the at least one first power line.

In some embodiments, the display panel further includes an encapsulation film layer disposed on a side of the plurality of pixel units distal from the base substrate and covering an area which is formed by the barrier structure in a surrounding fashion.

According to another aspect of the embodiments of the present disclosure, a method for manufacturing a display panel is provided. The method includes:

providing a base substrate, wherein the base substrate includes a display area and a peripheral area surrounding the display area; and forming a plurality of plurality of pixel units in the display area, and forming a barrier structure, at least one first power line and a row drive circuit in the peripheral area;

wherein the at least one first power line includes a first part and a second part, the first part is disposed on a side of the barrier structure distal from the plurality of pixel units and configured to receive a first power signal, the second part is electrically connected to the first part and first electrode layers in the plurality of pixel units respectively, the row drive circuit is electrically connected to the plurality of pixel units and configured to provide a drive signal for the plurality of pixel units; and orthographic projections of any two of the following structures on the base substrate is at least partially overlapped with each other: the barrier structure, the at least one first power line, and the row drive circuit.

According to still another aspect of the embodiments of the present disclosure, a display device provided. The display device includes: a power assembly, and the display panel according to the above aspect;

wherein the power assembly is configured to supply power to the display panel.

BRIEF DESCRIPTION OF THE DRAWINGS

For clearer descriptions of the technical solutions in embodiments of the present disclosure, accompanying drawings required for describing the embodiments are the following briefly as follows. Obviously, the accompanying drawings in the following description show merely some embodiments of the present disclosure, and persons of ordinary skill in the art may still derive other drawings from these accompanying drawings without creative efforts.

DETAILED DESCRIPTION

For clearer descriptions of the purposes, technical solutions, and advantages of the present disclosure, the embodiments of the present disclosure are described in detail hereinafter with reference to the accompanying drawings.

In the related art, since both a drive circuit and a VSS trace are disposed in a peripheral area, it is not conducive to achieve narrow frame of a display panel.

Technical terms in the embodiments of the present disclosure are only used to explain the embodiments of the present disclosure, and are not intended to limit the present disclosure. Unless otherwise defined, the technical terms or scientific terms used in the embodiments of the present disclosure shall be taken to mean the ordinary meanings as understood by a person of ordinary skill in the art to which the present disclosure belongs. The terms "first," "second," "third" and the like used in the description and claims of the present disclosure do not denote any order, quantity or importance, but are merely used to distinguish different components. Similarly, terms such as "a" or "one" do not indicate a quantitative limitation, but indicate the existence of at least one. The terms "comprise/include," "contain" and the like are intended to mean that the elements or objects prior to the terms cover the elements or objects or equivalents thereof listed after the terms, without excluding other elements or objects. The terms "connected," "joined," and the like are not limited to physical or mechanical connections, which may include electrical connection, and the connection may be direct or indirect. The terms "upper," "lower," "top," "bottom" and the like are only intended to indicate relative positional relations; and in the case that the absolute positions of the described object are changed, the relative positional relationships may be also changed accordingly.

Figure 1:
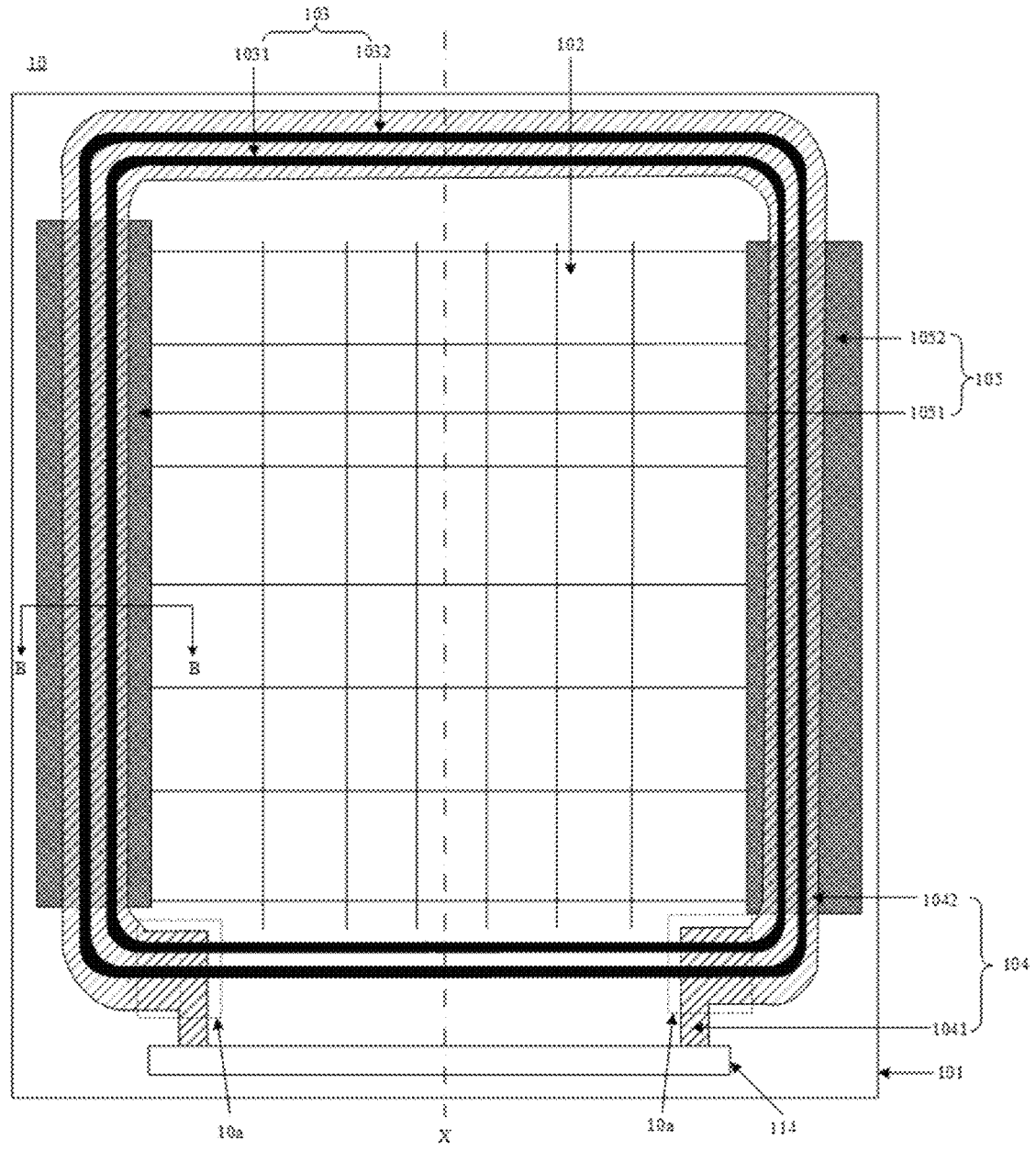
FIG. 1 is a schematic structural diagram of a display panel according to an embodiment of the present disclosure.

FIG. 1 is a schematic structural diagram of a display panel according to an embodiment of the present disclosure. Referring to FIG. 1, the display panel 10 includes a base substrate 101, a plurality of pixel units 102, a barrier structure 103, at least one first power line 104 and a row drive circuit 105.

Figure 2:
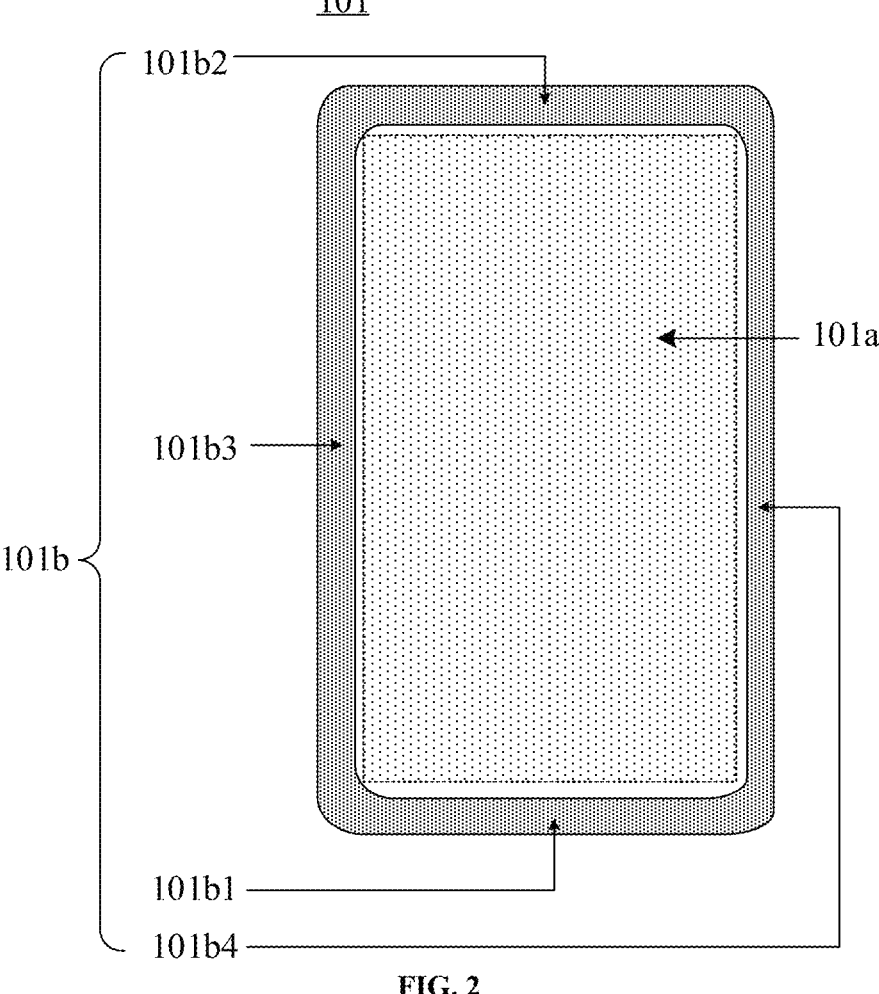
FIG. 2 is a schematic structural diagram of a base substrate according to an embodiment of the present disclosure.

FIG. 2 is a schematic structural diagram of a base substrate according to an embodiment of the present disclosure. Referring to FIG. 2, it can be seen that the base substrate 101 may include a display area 101*a* and a peripheral area 101*b* surrounding the display area 101*a*. Referring to FIGS. 1 and 2, the plurality of pixel units 102 are disposed in the display area 101*a*; and the barrier structure 103, the at least one first power line 104 and the row drive circuit 105 are disposed in the peripheral area 101*b*.

Referring to FIG. 1, the barrier structure 103 surrounds the plurality of pixel units 102. The at least one first power line 104 includes a first part 1041 and a second part 1042. The first part 1041 is disposed on a side of the barrier structure 103 distal from the plurality of pixel units 102, and configured to receive the first power signal. The second part 1042 surrounds the plurality of pixel units 102, and is electrically connected to the first part 1041 and first electrode layers b3 in the plurality of pixel units 102 respectively. The row drive circuit 105 is electrically connected to the plurality of pixel units 102, and is configured to provide a drive signal for the plurality of pixel units 102.

Referring to FIG. 1, orthographic projections of any two of the following structures on the base substrate 101 are at least partially overlapped with each other: the barrier structure 103, the at least one first power line 104, and the row drive circuit 105. In other words, the orthographic projection of the barrier structure 103 on the base substrate 101 is at least partially overlapped with the orthographic projection of the at least one first power line 104 on the base substrate 101; the orthographic projection of the barrier structure 103 on the base substrate 101 is at least partially overlapped with the orthographic projection of the row drive circuit 105 on the base substrate 101; and the orthographic projection of the at least one first power line 104 on the base substrate 101 is at least partially overlapped with the orthographic projection of the row drive circuit 105 on the base substrate 101.

In summary, the embodiment of the present disclosure provides a display panel; and each two of the barrier structure, the at least one first power line and the row drive circuit included in the display panel are partially overlapped with each other, such that the total width of each structure disposed in the peripheral area can be effectively reduced. In this way, the width of a frame of the display panel is reduced, which facilitates the realization of a display panel with a narrow frame.

In some embodiments, the first power signal provided by the second part 1042 of the first power line 104 for the first electrode layers b3 of the plurality of pixel units 102 may be a negative power signal. Therefore, the first power line 104 may also be referred to as a VS power line or VSS trace. The first electrode layer b3 may be a cathode layer. The material of the first power line 104 may include a metal material, and is configured to transmit the first power signal. A width of the first power line 104 ranges from 300 μm to 340 μm. For example, the width of the first power line 104 is 320 μm.

The orthographic projection of the first power line 104 on the base substrate 101 is at least partially overlapped with the orthographic projection of the row drive circuit 105 on the base substrate 101 and the voltage of the negative power signal transmitted by the first power line 104 is stable, such that influences of other circuits on a side of the first power line 104 distal from the base substrate 101 on the row drive circuit 105 can be effectively avoided. Therefore, the row drive circuit 105 is relatively stable.

In the embodiments of the present disclosure, a display area 101*a* where the orthographic projections of the plurality of pixel units 102 on the base substrate 101 are disposed is an active display area (AA) of the display panel 10. The barrier structure 103 may be disposed around the AA.

In some embodiments, the first electrode layers b3 of the plurality of pixel units 102 may be shared among each other, and the first electrode layer b3 may completely cover the AA. The orthographic projection of the first electrode layer b3 shared by the plurality of pixel units 102 on the base substrate 101 may be disposed within an orthographic projection of an area formed by the barrier structure 103 in a surrounding fashion on the base substrate 101.

In the embodiments of the present disclosure, the display panel 10 may be an organic light-emitting diode (OLED) display device or a liquid crystal display device, which is not limited in the embodiments of the present disclosure. In the embodiments of the present disclosure, an OLED display panel as the display panel 10 is taken as an example for description.

Figure 3:
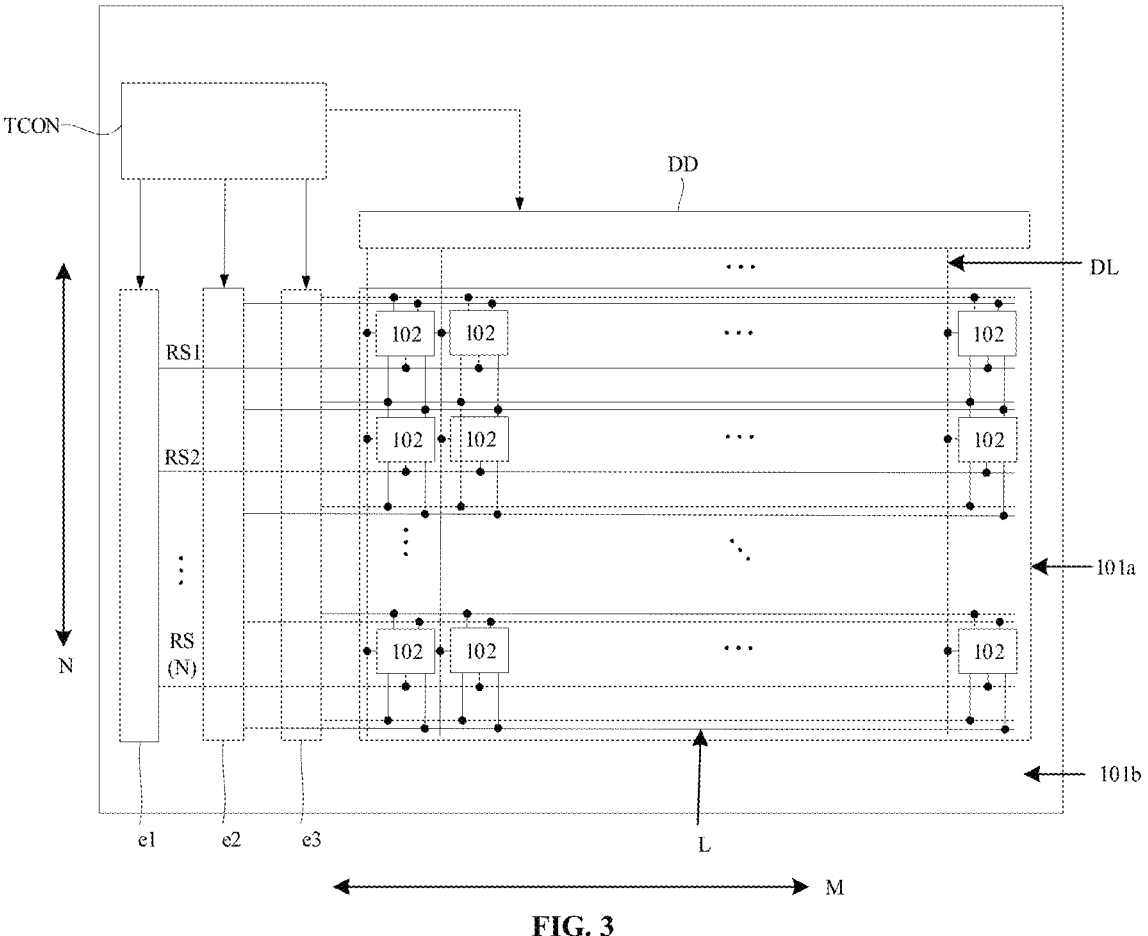
FIG. 3 is a schematic structural diagram of another display panel according to an embodiment of the present disclosure.

Referring to FIG. 3, the display panel 10 includes pixel units 102 in various colors in the display area 101*a*. The pixel unit 102 may also be referred to as a sub pixel. The pixel units 102 in various colors at least include a pixel unit of a first color, a pixel unit of a second color and a pixel unit of a third color. The first color, the second color and the third color may be three primary colors (such as red, green and blue).

For the convenience of description, in the embodiments of the present disclosure, the above pixel units 102 disposed in a matrix form are taken as an example for illustration. In this case, the pixel units 102 disposed in a row along a horizontal direction M are referred as to a row of pixel units. The pixel units 102 disposed in a row along a vertical direction N are referred as to a column of pixel units.

Figure 4:
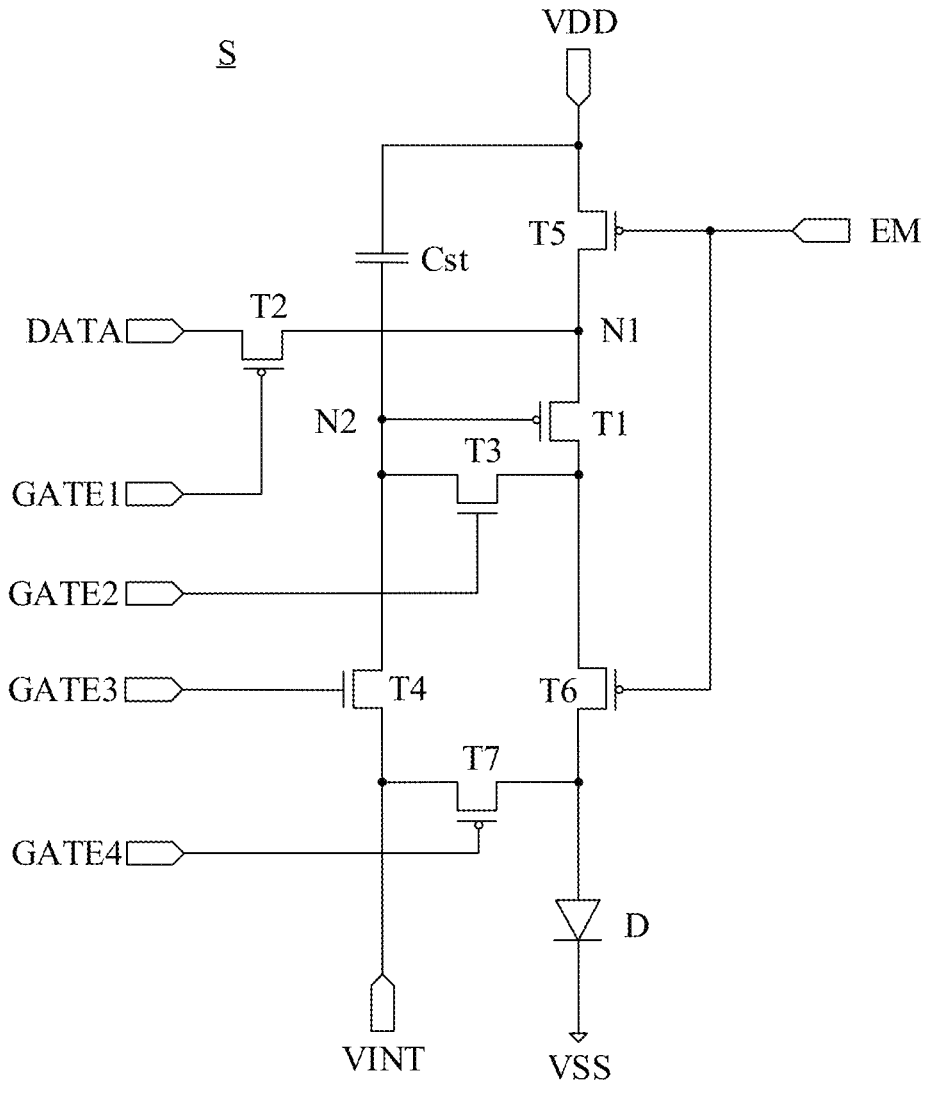
FIG. 4 is an equivalent circuit diagram of a pixel circuit according to an embodiment of the present disclosure.

Referring to FIG. 4, each of the pixel units 102 is provided with a pixel circuit S including a first transistor T1, a second transistor T2, a third transistor T3, a fourth transistor T4, a fifth transistor T5, a sixth transistor T6, a seventh transistor T7 and a capacitor Cst.

A control electrode of the first transistor T1 is coupled to a second node N2, and a first electrode of the first transistor T1 is coupled to a first node N1. A control electrode of the second transistor T2 is coupled to a first scanning signal terminal GATE1, a first electrode of the second transistor T2 is coupled to a data signal terminal DATA, and a second electrode of the second transistor T2 is coupled to the first node N1. A control electrode of the third transistor T3 is coupled to a second scanning signal terminal GATE2, a first electrode of the third transistor T3 is coupled to a second node N2, and a second electrode of the third transistor T3 is coupled to a second electrode of the first transistor T1. A control electrode of the fourth transistor T4 is coupled to a third scanning signal terminal GATE3, a first electrode of the fourth transistor T4 is coupled to an initial signal terminal VINT, and a second electrode of the fourth transistor T4 is coupled to the second node N2. A control electrode of the fifth transistor T5 is coupled to a light-emitting control signal terminal EM, a first electrode of the fifth transistor T5 is coupled to a first voltage signal terminal VDD, and a second electrode of the fifth transistor T5 is coupled to the first node N1. A control electrode of the sixth transistor T6 is coupled to the light-emitting control signal terminal EM, and a first electrode of the sixth transistor T6 is coupled to the second electrode of the first transistor T1. A control electrode of the seventh transistor T7 is coupled to a fourth scanning signal terminal GATE4, a first electrode of the seventh transistor T7 is coupled to the initial signal terminal VINT, and a second electrode of the seventh transistor T7 is coupled to a second electrode of the sixth transistor T6. A first terminal of the capacitor Cst is coupled to the first voltage signal terminal VDD, and a second terminal of the capacitor Cst is coupled to the second node N2.

The pixel circuit S further includes a light-emitting unit D. A first electrode of the light-emitting unit D is coupled to the second electrode of the sixth transistor T6, and a second electrode of the light-emitting unit D is coupled to a second voltage signal terminal VSS. The pixel circuits S in a same row are coupled to a same control signal line L, and the pixel circuits S in a same column are coupled to a same data line (DL). In this way, light-emitting units D in the pixel units 102 can be driven to emit light.

It should be noted that the pixel circuit S is not limited to the circuit structure shown in FIG. 4, but may be of other circuit structures, which are not listed herein.

The transistors included in the pixel circuits S may all be N-type transistors, or all be P-type transistors, or include both N-type and P-type transistors, which may be depended on actual needs. In addition, the transistors included in the pixel circuits S may all be low-temperature poly-silicon (LTPS) transistors, or all be oxide transistors, or include both the low-temperature poly-silicon transistor and the oxide transistor.

In some embodiments, the voltage for controlling the luminance of the pixel unit may be changed with time due to current leakage of the transistor in the pixel circuit S. Therefore, in order to keep the fluctuation of pixel lumi-nance within a reasonable range, there is a need to refresh data in the case that a static picture is displayed. Reducing the refresh frequency is an effective way to reduce power consumption in the case that the static picture is displayed. Meanwhile, there is still a need to maintain display quality by reducing the current leakage speed of the transistor in the pixel circuit S.

To solve the above problems, in some embodiments, the transistors (such as the first transistor T1, the fifth transistor T5 and the sixth transistor T6 in FIG. 4) for driving in the pixel circuit S may be set as oxide transistors by using a low-temperature polycrystalline oxide (LTPO) process in combination with excellent characteristics of low-tempera-ture poly-silicon and oxides. Therefore, current leakage of the transistors can be reduced due to the ultra-low current leakage characteristic of oxide semiconductors. The charg-ing speed and relatively low parasitic capacitance of the pixel unit 102 can be ensured by setting switch transistors (for example, the second transistor T2, the third transistor T3, the fourth transistor T4 and the seventh transistor T7) in the pixel circuit S as low-temperature poly-silicon transis-tors.

Referring to FIG. 3, the peripheral area 101*b* is provided with at least one row drive circuit 105 (for example, e1, e2 and e3 shown in FIG. 3 are row drive circuits) and a data drive circuit DD. In some embodiments, the row drive circuit 105 may be disposed on a side edge along an extension direction of a control signal line L. The data drive circuit DD may be disposed on a side edge along an extension direction of the data line DL, such that the pixel circuit S in the pixel unit 102 can be driven. In this way, the light-emitting unit is driven to emit light, such that the display panel 10 is capable of displaying.

In an exemplary embodiment, the row drive circuit may be a row drive circuit for transmitting a light-emitting control signal Em to the pixel circuit S, or may be a row drive circuit for transmitting a scanning signal Gate to the pixel circuit S.

For example, as shown in FIG. 3, the peripheral area 101*b* is provided with a first row drive circuit e1, a second row drive circuit e2 and a third row drive circuit e3. Referring to FIG. 4, the first row drive circuit e1 is configured to transmit the light-emitting control signal Em to the light-emitting control signal terminal EM of the pixel circuit S. The second row drive circuit e2 is configured to transmit a second scanning signal Gate2 to the second scanning signal terminal GATE2 of the pixel circuit S, and transmit a third scanning signal Gate3 to the third scanning signal terminal GATE3. The third row drive circuit e3 is configured to transmit a first scanning signal Gate1 to the first scanning signal terminal GATE1 of the pixel circuit S, and transmit a fourth scanning signal Gate4 to the fourth scanning signal terminal GATE4.

The number of the row drive circuits 105 included in the display panel 10 may be determined depending on a specific situation, and the above is just an example.

In some embodiments, the row drive circuit 105 may be a gate driver on array (GOA) circuit. That is, the row drive circuit 105 is directly integrated on an array substrate of the display panel 10. In the following embodiments, the GOA circuit as the row drive circuit is taken as an example for description. The following embodiments are all explained by taking the row drive circuit as a GOA circuit as an example.

It should be noted that, FIG. 3 is only schematic, in which the row drive circuit 105 is provided on one single side of the peripheral area 101*b* to drive all the control signal lines L sequentially row by row from the single side. That is, single-side driving is taken as an example for description. In other embodiments, row drive circuits 105 may be disposed on two side edges of the peripheral area 101*b* respectively along an extension direction of the control signal lines L. In this way, double-side driving is achieved by driving all the control signal lines L sequentially row by row from the two sides at the same time by two row drive circuits 105. In other embodiments, a first drive sub-circuit 1051 and the second drive sub-circuit 1052 of the row drive circuit 105 may be disposed on two side edges of the peripheral area 101*b* respectively along the extension direction of the control signal lines L. In this way, cross driving is achieved by driving all the control signal lines L sequentially row by row from the two sides by two row drive circuits 105 alternately.

In some embodiments of the present disclosure, the row drive circuit 105 includes a plurality of shift register circuits cascaded in sequence. Each stage of the shift register circuit is coupled to at least one control signal line L.

In an exemplary embodiment, as shown in FIG. 3, N stages of shift register circuits (RS1, RS2 . . . , and RS(N)) are coupled to N control signal lines (L1, L2 . . . , and L(N)) in one-to-one correspondence; each stage of the shift register circuit is coupled to one control signal line L; and each control signal line L is coupled to one row of sub-pixels P; wherein, N is a positive integer. That is, each stage of the shift register circuit drives one row of pixel units 102. In other embodiments, each control signal line L may be coupled to two adjacent rows of pixel units 102, That is, each stage of the shift register circuit, except the first and last stages of the shift register circuits, can drive two rows of pixel units 102.

For example, as shown in FIG. 3, in the case that the second row drive circuit e2 is disposed between the first row drive circuit e1 and the third row drive circuit e3 along the extension direction of the control signal line L, each stage of the shift register circuit in the second row drive circuit e2, except the first and last stages of the shift register circuits, drives two adjacent rows of pixel units 102. In addition, each stage of the shift register circuit in the third row drive circuit e3, except the first and last stages of the shift register circuits, drives two adjacent rows of pixel units 102.

For another example, in the case that the third row drive circuit e3 is disposed between the first row drive circuit e1 and the second row drive circuit e2 along the extension direction of the control signal line L, each stage of the shift register circuit in the second row drive circuit e2 drives one row of pixel units 102, and each stage of the shift register circuit in the third row drive circuit e3 drives one row of pixel units 102.

Referring to FIG. 3, it can also be seen that the display panel 10 may further include a timing controller (TCON). The TCON may be coupled to the shift register circuits, and is configured to transmit a voltage signal from the TCON to each of the shift register circuits.

In the embodiment of the present disclosure, referring to FIG. 2, the peripheral area 101*b* may include: a first area 101*b*1 and a second area 101*b*2 which are opposite and parallel to each other, and a third area 101*b*3 and a fourth area 101*b*4 which are opposite and parallel to each other. An extension direction of the first area 101*b*1 is perpendicular to an extension direction of the third area 101*b*3.

In some embodiments, the first area 101*b*1 may be an area below the display area 101*a*; the second area 101*b*2 may be an area above the display area 101*a*; the third area 101*b*3 may be an area on the left side of the display area 101*a*; and the fourth area 101*b*4 may be an area on the right side of the display area 101*a*.

Referring to FIGS. 1 and 2, the first part 1041 of the first power line 104 may be disposed in the first area 101*b*1; and the second part 1042 may be disposed in the second area 101*b*2, the third area 101*b*3 and the fourth area 101*b*4. In other words, the second part 1042 of the first power line 104 may surround three edges of the display area 101*a*. The second part 1042 may also surround two edges or four edges of the display area 101*a*, which is not limited in the embodiments of the present disclosure.

In the embodiments of the present disclosure, the part of the barrier structure 103 through which the power line passes may be referred to as a line inlet port. For example, the part through which the first power line 104 passes may be referred to as a first line inlet port 10*a*. Referring to FIG. 1, the first power line 104 may include two first parts 1041. In this way, the two first parts 1041 may respectively pass through the barrier structure 103. The barrier structure 103 may be provided with two first line inlet ports 10*a* through which the two first parts 1041 pass.

In addition, the two first parts 1041 may be symmetrically disposed about an axis X of the base substrate 101. For example, two first parts 1041 may be disposed on two sides of the base substrate 101. The axis X of the base substrate 101 may be parallel to a column direction of the plurality of pixel units 102.

In some embodiments, the two first parts 1041 disposed on the two sides of the base substrate 101 may mean that, for one first part 1041 disposed on a same side of the axis X as the third area 101*b*3, a distance between the first part 1041 and the third area 101*b*3 is less than a distance between the first part 1041 and the axis X. For the other first part 1041 disposed on a same side of the axis X as the fourth area 101*b*4, a distance between the first part 1041 and the fourth area 101*b*4 is less than the distance between the first part 1041 and the axis X.

Referring to FIG. 1, it can also be seen that the first power line 104 may also include a second part 1042. One end of the second part 1042 may be connected to one first part 1041, and the other end of the second part 1042 may be connected to the other first part 1041. In some embodiments, the two first parts 1041 and one second part 1042 may be formed as an integrated structure. Moreover, the second part 1042 of the first power line 104 may be formed as a non-enclosed structure.

In the embodiment of the present disclosure, the row drive circuit 105 may include a first drive sub-circuit 1051 and a second drive sub-circuit 1052. The first drive sub-circuit 1051 may be disposed in the third area 101*b*3; and the second drive sub-circuit 1052 may be disposed in the fourth area 101*b*4.

In this way, an orthographic projection of the first drive sub-circuit 1051 on the base substrate 101 is overlapped with both an orthographic projection of the part of the second part 1042 disposed in the third area 101*b*3 on the base substrate 101 and an orthographic projection of the part of the barrier structure 103 disposed in the third area 101*b*3 on the base substrate 101. An orthographic projection of the second drive sub-circuit 1052 on the base substrate 101 is overlapped with both an orthographic projection of the part of the second part 1042 disposed in the fourth area 101*b*4 on the base substrate 101 and an orthographic projection of the part of the barrier structure 103 disposed in the fourth area 101*b*4 on the base substrate 101.

In some embodiments, both the first drive sub-circuit 1051 and the second drive sub-circuit 1052 may include a light-emitting control (EM) circuit, a first-type drive circuit and a second-type drive circuit. The light-emitting control circuit may be the first row drive circuit e1 in FIG. 3. The first-type drive circuit may be one of the second row drive circuit e2 and the third row drive circuit e3 in FIG. 3. The second-type drive circuit may be the other of the second row drive circuit e2 and the third row drive circuit e3 in FIG. 3.

In some embodiments, the first-type drive circuit may be an N-type drive circuit. The second-type drive circuit may be a P-type drive circuit. Both the N-type drive circuit and the P-type drive circuit may include a P-type transistor. In addition, the difference between the N-type drive circuit and the P-type drive circuit lies in that the potential of a scanning signal provided by the N-type drive circuit is greater than the potential of a scanning signal provided by the P-type drive circuit.

The orthographic projection of the first power line 104 on the base substrate 101 may be at least partially overlapped with the orthographic projection of the light-emitting control circuit on the base substrate 101. In some embodiments, a width of the first power line 104 may be 1.5 to 2.5 times a length of the light-emitting control circuit along a row direction. For example, the length of the light-emitting control circuit along the row direction ranges from 150 μm to 190 μm, and for example, may be 170 μm.

Based on the width of the first power line 104 and the length of the light-emitting control circuit along the row direction, it can be known that the width of the first power line 104 is greater than the width of the light-emitting control circuit. Thus, one part of the orthographic projection of the first power line 104 on the base substrate 101 is overlapped with the orthographic projection of the light-emitting control circuit on the base substrate 101, and the other part of the orthographic projection of the first power line 104 on the base substrate 101 is overlapped with the orthographic projection of the N-type drive circuit on the base substrate.

Figure 5:
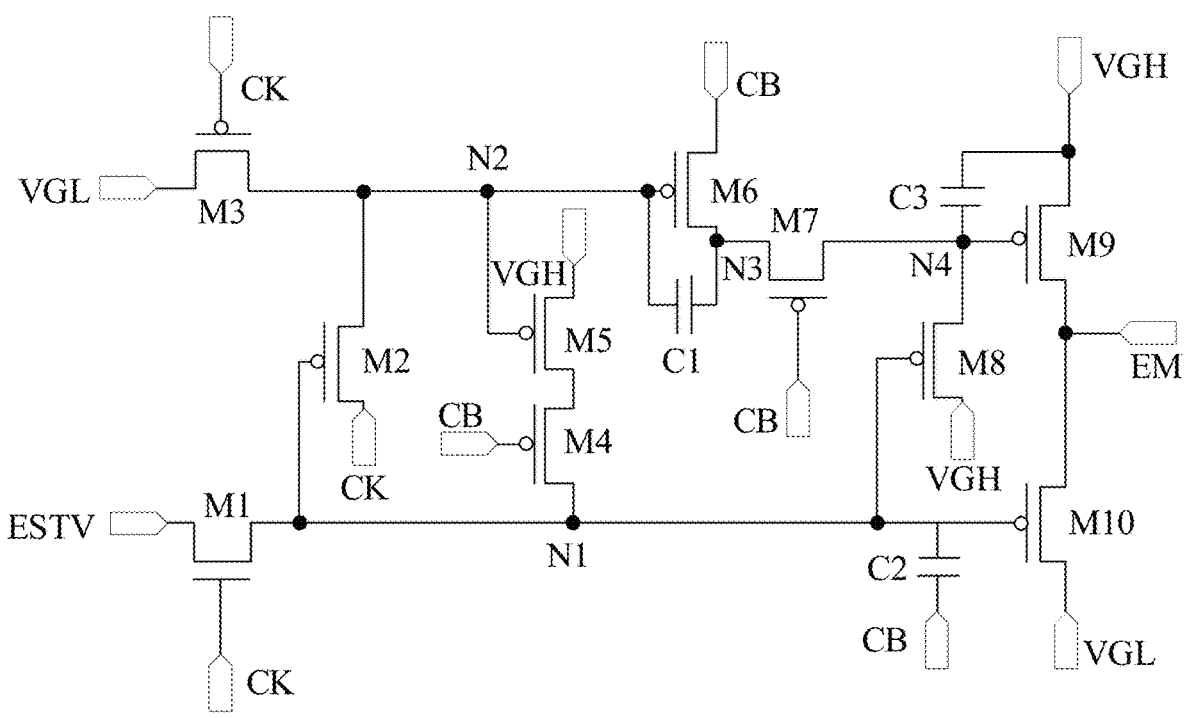
FIG. 5 is an equivalent circuit diagram of a light-emitting control circuit according to an embodiment of the present disclosure.

FIG. 5 is an equivalent circuit diagram of a light-emitting control circuit according to an embodiment of the present disclosure. The transistor in the light-emitting control circuit is denoted by M, so as to distinguish it from each transistor in the pixel circuit. Referring to FIG. 5, the light-emitting control circuit includes a first transistor M1, a second transistor M2, a third transistor M3, a fourth transistor M4, a fifth transistor M5, a sixth transistor M6, a seventh transistor M7, an eighth transistor M8, a ninth transistor M9, a tenth transistor M10, a first capacitor C1, a second capacitor C2, and a third capacitor C3.

A control electrode of the first transistor M1 is coupled to the first clock signal terminal CK, a first electrode of the first transistor M1 is coupled to an initial signal terminal ESTV, and a second electrode of the first transistor M1 is coupled to a first node N1. A control electrode of the second transistor M2 is coupled to the first node N1, a first electrode of the second transistor M2 is coupled to the first clock signal terminal CK, and a second electrode of the second transistor M2 is coupled to a second node N2. A control electrode of the third transistor M3 is coupled to the first clock signal terminal CK, a first electrode of the third transistor M3 is coupled to a first power terminal VGL, and a second electrode of the third transistor M3 is coupled to the second node N2. A control electrode of the fourth transistor M4 is coupled to a second clock signal terminal CB, a first electrode of the fourth transistor M4 is coupled to the first node N1, and a second electrode of the fourth transistor M4 is coupled to a first electrode of the fifth transistor M5. A control electrode of the fifth transistor M5 is coupled to the second node N2, and a second electrode of the fifth transistor M5 is coupled to a second power terminal VGH. A control electrode of the sixth transistor M6 is coupled to the second node N2, a first electrode of the sixth transistor M6 is coupled to the second clock signal terminal CB, and a second electrode of the sixth transistor M6 is coupled to the third node N3. A control electrode of the seventh transistor M7 is coupled to the second clock signal terminal CB, a first electrode of the seventh transistor M7 is coupled to the third node N3, and a second electrode of the seventh transistor M7 is coupled to a fourth node. A control electrode of the eighth transistor M8 is coupled to the first node N1, a first electrode of the eighth transistor M8 is coupled to the second power terminal VGH, and a second electrode of the eighth transistor M8 is coupled to the fourth node N4. A control electrode of the ninth transistor M9 is coupled to the fourth node N4, a first electrode of the ninth transistor M9 is coupled to the second power terminal VGH, and a second electrode of the ninth transistor M9 is coupled to an output terminal EM of the light-emitting control circuit. A control electrode of the tenth transistor M10 is coupled to the first node N1, a first electrode of the tenth transistor M10 is coupled to the first power terminal VGL, and a second electrode of the tenth transistor M10 is coupled to the output terminal of the light-emitting control circuit. A first terminal of the first capacitor C1 is coupled to the second node N2, and a second terminal of the first capacitor C1 is coupled to a third node N3. A first terminal of the second capacitor C2 is coupled to the first node N1, and a second terminal of the second capacitor C2 is coupled to the second clock signal terminal CB. A first terminal of the third capacitor C3 is coupled to the fourth node N4, and a second terminal of the third capacitor C3 is coupled to the second power terminal VGH.

Figure 6:
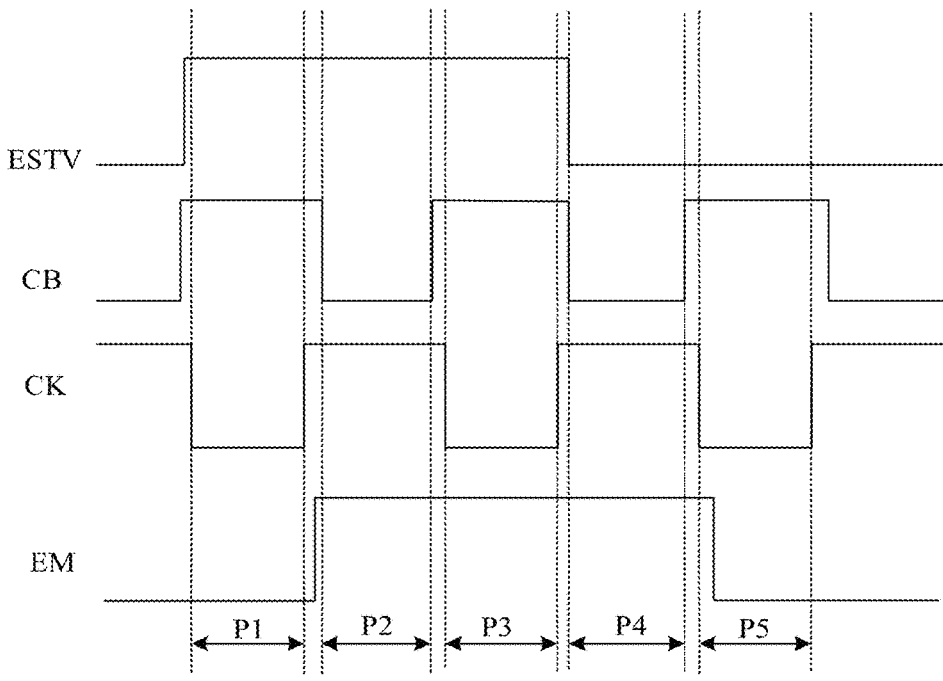
FIG. 6 is a timing diagram of a light-emitting control circuit according to an embodiment of the present disclosure.

FIG. 6 is a timing diagram of a light-emitting control circuit according to an embodiment of the present disclosure. Description is given as follows with reference to FIG. 6.

In a first stage P1, a first clock signal of the first clock signal CK is at a low level, such that the first transistor M1 and the third transistor M3 are turned on. A high-level initial signal of the initial signal terminal ESTV is transmitted to the first node N1 by the turned-on first transistor M1, such that the level of the first node N1 becomes a high level. In this way, the second transistor M2, the eighth transistor M8 and the tenth transistor M10 are turned off. In addition, a low-level first voltage of the first power terminal VGL is transmitted to the second node N2 by the turned-on third transistor M3, such that the level of the second node N2 becomes a low level. In this way, the fifth transistor M5 and the sixth transistor M6 are turned on. Since a second clock signal of the second clock signal terminal CB is at a high level, the seventh transistor M7 is turned off. In addition, the level of the fourth node N4 may remain high due to a storage function of the third capacitor C3, such that the ninth transistor M9 is turned off. In the first stage P1, the ninth transistor M9 and the tenth transistor M10 are both turned off, such that a light-emitting control pulse signal output by the output terminal EM of the light-emitting control circuit remains at a low level as before.

In a second stage P2, the second clock signal of the second clock signal terminal CB is at a low level, such that the fourth transistor M4 and the seventh transistor M7 are turned on. Since the first clock signal of the first clock signal terminal CK is at a high level, the first transistor M1 and the third transistor M3 are both turned off. The second node N2 can maintain at a low level as in the previous stage due to a storage function of the first capacitor C1, such that the fifth transistor M5 and the sixth transistor M6 are turned on. A high-level second voltage of the second power terminal VGH is transmitted to the first node N1 via the turned-on fifth transistor M5 and fourth transistor M4, such that the level of the first node N1 continues to maintain the high level as in the previous stage. In this way, the second transistor M2, the eighth transistor M8 and the tenth transistor M10 are turned off. In addition, a low-level second clock signal of the second clock signal terminal CB is transmitted to the fourth node N4 via the turned-on sixth transistor M6 and seventh transistor M7, such that the level of the fourth node N4 becomes a low level, such that the ninth transistor M9 is turned on. A high-level second voltage is output by the turned-on ninth transistor M9, such that the light-emitting control pulse signal output by the output terminal EM of the light-emitting control circuit in the second stage P2 is at a high level.

In a third stage P3, the first clock signal of the first clock signal terminal CK is at a low level, such that the first transistor M1 and the third transistor M3 are turned on. The second clock signal of the second clock signal terminal CB is at a high level, such that the fourth transistor M4 and the seventh transistor M7 are turned off. The level of the fourth node N4 may maintain at a low level as in the previous stage due to the storage function of the third capacitor C3, such that the ninth transistor M9 can be kept in a turned-on state. A high-level second voltage is output by the turned-on ninth transistor M9, such that the light-emitting control pulse signal output by the output terminal EM of the light-emitting control circuit in the third stage P3 is still at a high level.

In a fourth stage P4, the first clock signal of the first clock signal terminal CK is at a high level, such that the first transistor M1 and the third transistor M3 are turned off. The second clock signal of the second clock signal terminal CB is at a low level, such that the fourth transistor M4 and the seventh transistor M7 are turned on. The level of the first node N1 maintains a high level as in the previous stage due to a storage function of the second capacitor C2, such that the second transistor M2, the eighth transistor M8 and the tenth transistor M10 are turned off. The second node N2 maintains at a low level as in the previous stage due to the storage function of the first capacitor C1, such that the fifth transistor M5 and the sixth transistor M6 are turned on. In addition, a low-level second clock signal of the second clock signal terminal CB is transmitted to the fourth node N4 via the turned-on sixth transistor M6 and seventh transistor M7, such that the level of the fourth node N4 becomes a low level, such that, the ninth transistor M9 is turned on. A high-level second voltage is output by the turned-on ninth transistor M9, such that the light-emitting control pulse signal output by the output terminal EM of the light-emitting control circuit in the second stage P4 is still at a high level.

In a fifth stage P5, the first clock signal of the first clock signal terminal CK is at a low level, such that the first transistor M1 and the third transistor M3 are turned on. The second clock signal of the second clock signal terminal CB is at a high level, such that the fourth transistor M4 and the seventh transistor M7 are turned off. A low-level initial signal of the initial signal terminal ESTV is transmitted to the first node N1 by the turned-on first transistor M1, such that the level of the first node N1 becomes a low level. In this way, the second transistor M2, the eighth transistor M8 and the tenth transistor M10 are turned on. A low-level first clock signal of the first clock signal terminal CK is transmitted to the second node N2 by the turned-on second transistor M2, such that the level of the second node N2 can be further lowered. In this way, the second node N2 continues to remain at a low level as in the previous stage, such that the fifth transistor M5 and the sixth transistor M6 are turned on. In addition, a high-level second voltage is transmitted to the fourth node N4 by the turned-on eighth transistor M8, such that the level of the fourth node N4 becomes a high level. In this way, the ninth transistor M9 is turned off. A low-level second voltage is output by the turned-on tenth transistor M10, such that the light-emitting control pulse signal output by the output terminal EM of the light-emitting control circuit in the fifth stage P5 becomes a low level.

In the embodiments of the present disclosure, referring to FIG. 1, the barrier structure 103 may be formed as a ring structure surrounding a plurality of pixel units 102, and is configured to block the overflow of an organic layer in an area formed by the barrier structure 103 in a surrounding fashion in the display panel 10. The barrier structure 103 may include a first barrier dam 1031 and a second barrier dam 1032. The first barrier dam 1031 is proximal to the plurality of pixel units 102 relative to the second barrier dam 1032. Moreover, a thickness of the first barrier dam 1031 may be less than a thickness of the second barrier dam 1032.

The overflow of organic layer in the area formed by barrier structure 103 in a surrounding fashion can be further prevented by providing the two barrier dams and setting the thickness of the second barrier dam 1032 distal from the plurality of pixel units 102 to be greater than the thickness of the first barrier dam 1031 proximal to the plurality of pixel units 102. The barrier structure 103 may also include one barrier dam, or more barrier dams, which is not limited in the embodiments of the present disclosure.

Referring to FIG. 1, both an orthographic projection of the first barrier dam 1031 and an orthographic projection of the second barrier dam 1032 on the base substrate 101 may be in a shape of ring. The first barrier dam 1031 is proximal to the pixel units 102 relative to the second barrier dam 1032, which may be configured to indicate that an area formed by the first barrier dam 1031 in a surrounding fashion is disposed within an area formed by the second barrier dam 1032 in a surrounding fashion.

In some embodiments, both a width of the first barrier dam 1031 and a width of the second barrier dam 1032 may be 0.25 to 0.5 times a width of the light-emitting control circuit. For example, both the width of the first barrier dam 1031 and the width of the second barrier dam 1032 are greater than, or equal to 40 μm. In addition, the distance between the first barrier dam 1031 and the second barrier dam 1032 may be greater than, or equal to 40 μm.

Figure 7:
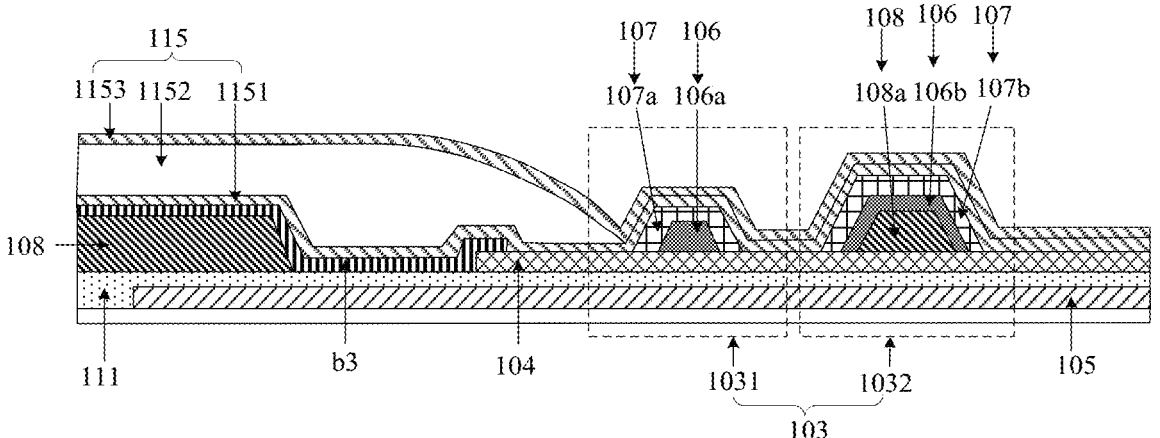
FIG. 7 is a sectional view of the display panel shown in FIG. 1 in BB direction.

FIG. 7 is a sectional view of the display panel shown in FIG. 1 in BB direction. Referring to FIG. 7, the first barrier dam 1031 may include a first pattern 106a and a second pattern 107a sequentially laminated in a direction going away from the base substrate 101. The second barrier dam 1032 may include a third pattern 108a, a fourth pattern 106b, and a fifth pattern 107b sequentially laminated in a direction going away from the base substrate 101. The first pattern 106a and the fourth pattern 106b may be disposed in a pixel define layer (PDL) 106 of the display panel 10. The second pattern 107a and the fifth pattern 107b may be disposed in a support layer 107 of the display panel. The third pattern 108a may be disposed in a first planarization (PLN) layer 108 of the display panel.

The patterns on a same layer may be made of a same material by a one-time patterning process. For example, the first pattern 106a and the fourth pattern 106b may be made of a same material by a one-time patterning process. The second pattern 107a and the fifth pattern 107b may be made of a same material by a one-time patterning process.

Referring to FIG. 7, the second barrier dam 1032 is provided with a third pattern 108a of the first planarization layer 108 more than the first barrier dam 1031, such that the thickness of the second barrier dam 1032 can be greater than the thickness of the first barrier dam 1031. In this way, the organic layer can be prevented from overflowing.

In some embodiments, materials for manufacturing the pixel define layer 106, the support layer 107, and the first planarization layer 108 may include organic materials such as resin, which are not limited in the embodiments of the present disclosure.

Figure 8:
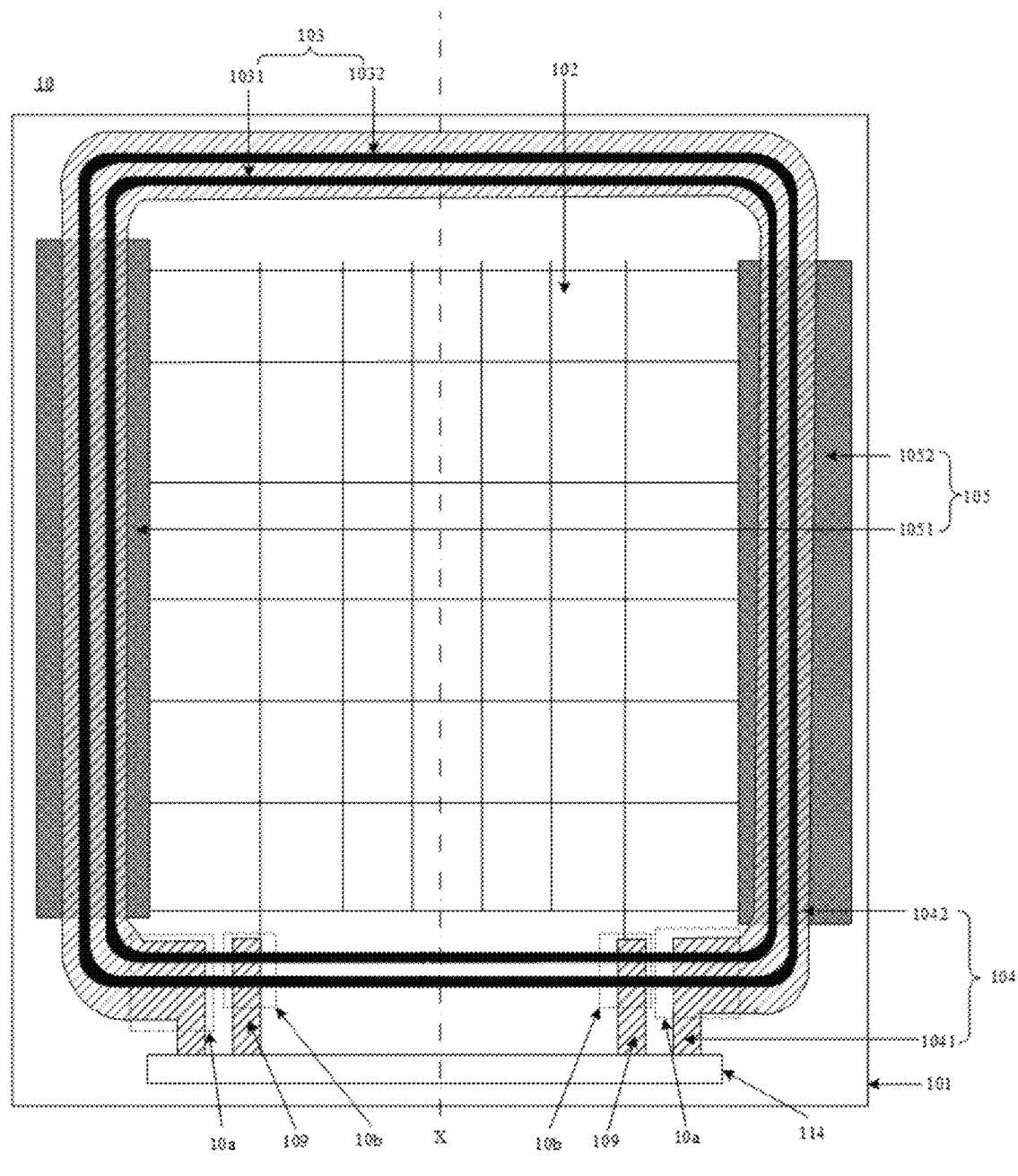
FIG. 8 is a schematic structural diagram of yet another display panel according to an embodiment of the present disclosure.

FIG. 8 is a schematic structural diagram of yet another display panel according to an embodiment of the present disclosure. Referring to FIG. 8, the display panel may further include at least one second power line 109 disposed in the peripheral area 101b. One end of the at least one second power line 109 may be disposed on a side of the barrier structure 103 distal from the plurality of pixel units 102, and is configured to receive a second power signal; and the other end of the at least one second power line 109 may be disposed on a side of the barrier structure 103 proximal to the plurality of pixel units 102, and is electrically connected to the plurality of pixel units 102, such that the second power line 109 can provide the second power signal for the plurality of pixel units 102. In some embodiments, each second power line 109 may be disposed in the first area 101b1 of the peripheral area 101b.

In some embodiments, the other end of the at least one second power line 109 may be electrically connected to thin film transistors 1021 in the plurality of pixel units 102, and for example, may be connected to a source electrode a81 or a drain electrode a82 of the thin film transistor 1021 in each of the plurality of pixel units 102. The second power signal provided by the second power line 109 for the thin film transistor 1021 in the pixel unit 102 may be a positive power signal. Therefore, the second power line 109 may also be referred to as a VDD power line or a VDD trace.

In addition, an orthographic projection of at least one second power line 109 on the base substrate 101 may be at least partially overlapped with the orthographic projection of the barrier structure 103 on the base substrate 101. For example, the orthographic projections of the two second power lines 109 included in the display panel 10 on the base substrate 101 are at least partially overlapped with the orthographic projection of the barrier structure 103 on the base substrate 101, such that the width of the first area 101b1 where the second power line 109 is provided in the base substrate 101 can be reduced. In this way, a width of the frame of the display panel 10 can be reduced, which facilitates the realization of a display panel 10 with a narrow frame.

Referring to FIG. 8, one end of each second power line 109 is disposed outside the area formed by the barrier structure 103 in a surrounding fashion, and the other end of the second power line 109 is disposed inside the area formed by the barrier structure 103 in a surrounding fashion. That is, each second power line 109 may pass through the barrier structure 103 to enter the area formed by the barrier structure 103 in a surrounding fashion. The part of the barrier structure 103 through which the second power line 109 passes may be referred to as a second wire inlet 10b.

Generally, the second power signal received by the second power line 109 needs to be transmitted to each of the plurality of pixel units 102 in the display area 101a. Moreover, the pixel unit 102 with a longer distance from the second power line 109 has a less reliability of receiving the second power signal than the pixel unit 102 with a shorter distance from the second power line 109.

As an optional embodiment, referring to FIG. 8, the display panel 10 may include two second power lines 109, and the two second power lines 109 may be symmetrically disposed about the axis X of the base substrate 101. Therefore, the reliability of the second power signal received by each pixel unit 102 can be improved by using two second power lines 109 to transmit the second power signals, compared with a case of only using one second power line 109 to transmit the second power signals.

In some embodiments, the two second power lines 109 may be disposed on two sides of the base substrate 101. The two second power lines 109 disposed on the two sides of the base substrate 101 may mean that, the distance between each of the second power lines 109 and the first part 1041 of the first power line 104 disposed on a same side of the axis X is less than the distance between the second power line 109 and the axis X. In other words, for one second power line 109 disposed on a same side of the axis X as one of the two first parts 1041 included in the first power line 104, the distance between the second power line 109 and the first part 1041 is less than the distance between the second power line 109 and the axis X. For the other second power line 109 disposed on a same side of the axis X as the other first part 1041 included in the first power line 104, the distance between the second power line 109 and the other first part 1041 is less than the distance between the second power line 109 and the axis X.

Alternatively, the two second power lines 109 may also be disposed in the middle of the base substrate 101, and positions of the second power lines 109 are not limited in the embodiments of the present disclosure. The two second power lines 109 disposed in the middle of the base substrate 101 may mean that, the distance between each of the second power lines 109 and the first part 1041 of the first power line 104 disposed on a same side of the axis X is greater than the distance between the second power line 109 and the axis X.

Figure 9:
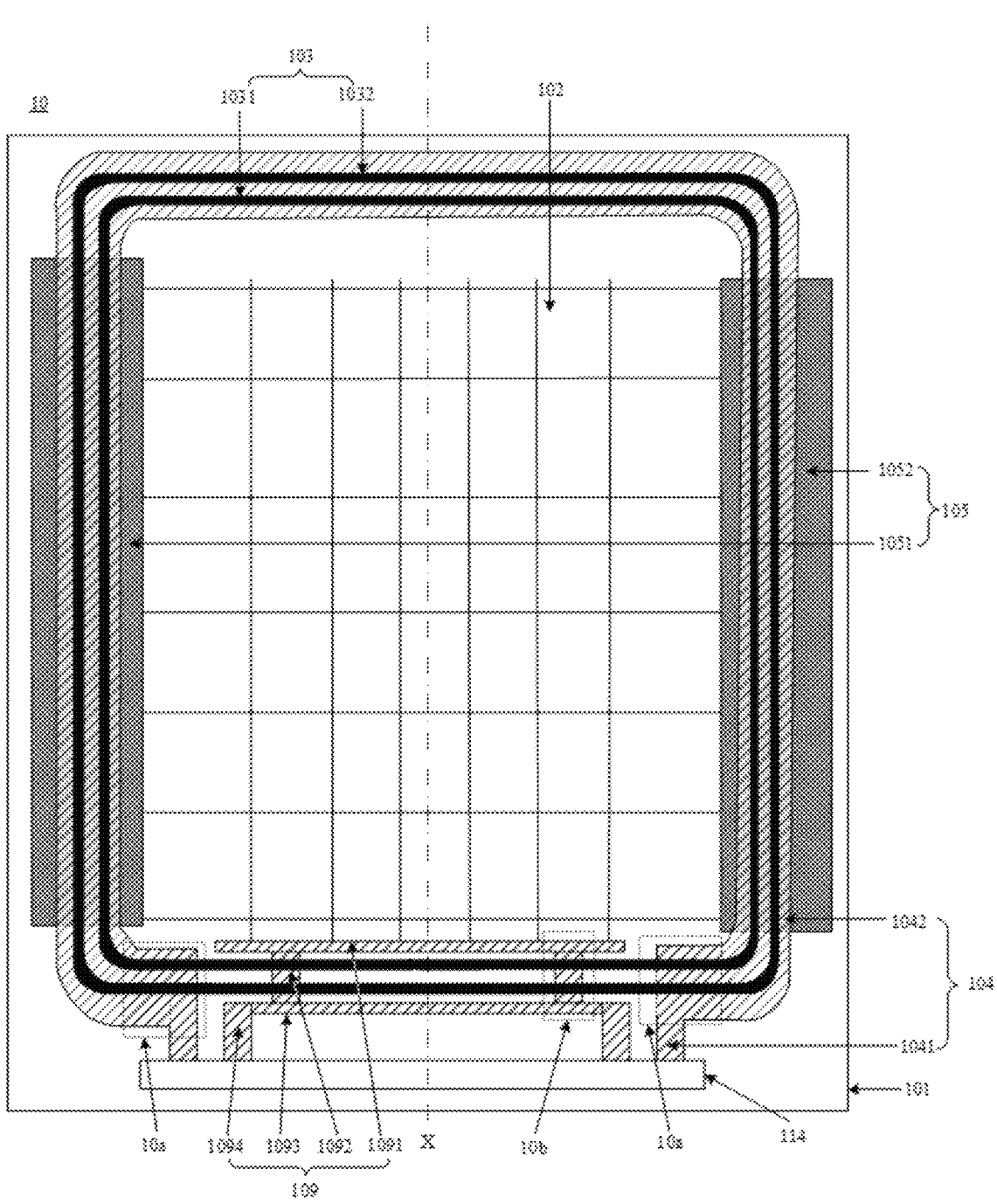
FIG. 9 is a schematic structural diagram of still another display panel according to an embodiment of the present disclosure.

As another optional embodiment, referring to FIG. 9, the second power line 109 included in the display panel 10 may include a third part 1091, two fourth parts 1092, a fifth part 1093, and two sixth parts 1094. The third part 1091 is disposed on a side of the barrier structure 103 proximal to the plurality of pixel units 102, and is electrically connected to the plurality of pixel units 102. The two fourth parts 1092 are both disposed on a side of the third part 1091 distal from the plurality of pixel units 102, and are electrically connected to the third part 1091. The fifth part 1093 is disposed on a side of the two fourth parts 1092 distal from the plurality of pixel units 102, and is electrically connected to the two fourth parts 1092. The two sixth parts 1094 are disposed on a side of the barrier structure 103 distal from the plurality of pixel units 102, are configured to receive the second power signal, and are electrically connected to the fifth part 1093. Referring to FIG. 9, the two fourth parts 1092 are symmetrically disposed about the axis X of the base substrate 101, and the two sixth parts are symmetrically disposed about the axis X of the base substrate 101.

In this way, the second power signal received by the second power line 109 may be transmitted to the pixel units 102 disposed in all the areas of the display area 101a via the second power line 109 including the third part 1091, the two fourth parts 1092, the fifth part 1093 and the two sixth parts 1094, such that the reliability and the consistency of the second power signal received by the pixel units 102 disposed in all the areas of the display area 101a are ensured. In this way, the display effect of the display panel is ensured.

In some embodiments, the third part 1091, the two fourth parts 1092, the fifth part 1093, and the two sixth parts 1094 that are included in the second power line 109 may be made by a same one-time patterning process using a same material. Moreover, the third part 1091, the two fourth parts 1092, the fifth part 1093, and the two sixth parts 1094 may be formed as an integrated structure.

Referring to FIG. 9, the two sixth parts 1094 may be disposed on two sides of the base substrate 101. The two sixth parts 1094 disposed on the two sides of the base substrate 101 may mean that, the distance between each of the sixth parts 1094 and the first part 1041 of the first power line 104 disposed on a same side of the axis X is less than the distance between the sixth part 1094 and the axis X. In other words, for one sixth part 1094 disposed on a same side of the axis X as one of the two first parts 1041 included in the first power line 104, the distance between the sixth part 1094 and the first part 1041 is less than the distance between the sixth part 1094 and the axis X. For the other sixth part 1094 disposed on a same side of the axis X as the other first part 1041 included in the first power line 104, the distance between the sixth part 1094 and the other first part 1041 is less than the distance between the sixth part 1094 and the axis X.

In addition, referring to FIG. 9, both the third part 1091 and the fifth part 1093 extend along the row direction, and both the two fourth parts 1092 and the two sixth parts 1094 extend along the column direction. The extension direction of any of the two fourth parts 1092 is not overlapped with the extension direction of any of the sixth parts 1094. The extension direction of each of the two fourth parts 1092 may be overlapped with the extension direction of the sixth part 1094 on a same side, which is not limited in the embodiments of the present disclosure.

In the case that the display panel 10 includes the third part 1091, the two fourth parts 1092, the fifth part 1093 and the two sixth parts 1094, the orthographic projection of each of the two fourth parts 1092 on the base substrate 101 may be at least partially overlapped with the orthographic projection of the barrier structure 103 on the base substrate 101. For example, one side of each the fourth parts 1092 proximal to the pixel units 102 is disposed inside the area formed by the barrier structure 103 in a surrounding fashion, and the other side of the fourth part 1092 distal from the pixel units 102 is disposed outside the area formed by the barrier structure 103 in a surrounding fashion.

Figure 10:
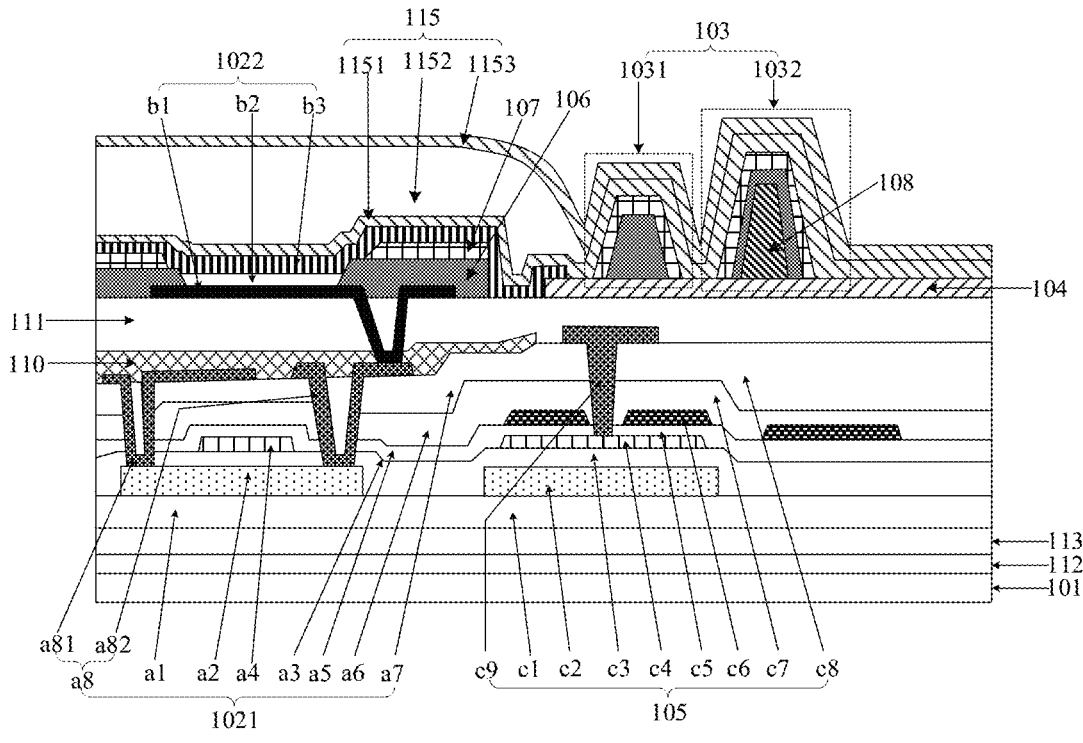
FIG. 10 is a schematic structural diagram of still another display panel according to an embodiment of the present disclosure.

FIG. 10 is a schematic structural diagram of still another display panel according to an embodiment of the present disclosure. Referring to FIG. 10, it can be seen that each pixel unit 102 included in the display panel may include a thin film transistor (TFT) 1021 and a light-emitting unit 1022 sequentially laminated in a direction going away from the base substrate 101. One pixel unit 102 is shown in FIG. 7, and the thin film transistor 1021 in the pixel unit 102 shown in FIG. 7 may be the transistor in FIG. 4.

Referring to FIG. 10, the thin film transistor 1021 may include a first buffer layer a1, a first active pattern a2, a first gate insulation layer (GI) a3, a first gate pattern a4, a second gate insulation layer a5, a second buffer layer a6, an interlayer dielectric (ILD) layer a7, and a source-drain electrode a8 which are sequentially laminated in the direction going away from the base substrate 101. The source-drain electrode a8 may include a source (S) electrode a81 and a drain (D) electrode a82 which are spaced apart from each other, and may be both connected to the first active pattern a2.

In some embodiments, the thin film transistor 1021 shown in FIG. 10 may be a polysilicon transistor. The display panel 10 may further include an LTPO thin film transistor. Since the LTPO thin film transistor 1021 includes an oxide layer, electrons can pass through the LTPO thin film transistor faster and better. In this way, the energy consumption required to excite the light-emitting unit 1022 in the pixel unit 102 to emit light is reduced, such that the power of the display panel 10 consumed during display is reduced.

Referring to FIG. 10, the light-emitting unit 1022 may include an electrode pattern b1, a light-emitting pattern b2, and a first electrode layer b3 which are sequentially laminated in the direction going away from the base substrate 101. The electrode pattern b1 may be disposed in the second electrode layer and connected to the drain electrode a82.

Referring to FIG. 10, it can also be seen that the row drive circuit 105 included in the display panel 10 may further include a first buffer layer c1, a second active pattern c2, a first gate insulation layer c3, a second gate pattern c4, a second gate insulation layer c5, a third gate pattern c6, a second buffer layer c7, an interlayer dielectric layer c8, and a connection layer c9 which are sequentially laminated in the direction going away from the base substrate 101. The connection layer c9 may be connected to the first gate pattern a4, such that a function of signal transmission is realized.

In the embodiment of the present disclosure, the thin film transistor 1021 in each of the pixel units 102 and the row drive circuit 105 included in the display panel 10 share the first buffer layer, the first gate insulation layer, the second gate insulation layer, the second buffer layer and the interlayer dielectric layers. In other words, the first buffer layer a1 of the thin film transistor 1021 and the first buffer layer c1 of the row drive circuit 105 are formed as an integrated structure. The first gate insulation layer a3 of the thin film transistor 1021 and the first gate insulation layer c3 of the row drive circuit 105 are formed as an integrated structure. The second gate insulation layer a5 of the thin film transistor 1021 and the second gate insulation layer c5 of the row drive circuit 105 are formed as an integrated structure. The second buffer layer a6 of the thin film transistor 1021 and the second buffer layer c7 of the row drive circuit 105 are formed as an integrated structure. The interlayer dielectric layer a7 of the thin film transistor 1021 and the interlayer dielectric layer c8 of the row drive circuit 105 are formed as an integrated structure.

In addition, the first active patterns a2 of the thin film transistors 1021 in the plurality of pixel units 102 and the second active pattern c2 of the row drive circuit 105 included in the display panel 10 are disposed in an active layer. In other words, the first active pattern a2 and the second active pattern c2 may be made of a same material by a same one-time patterning process. The first gate patterns a4 of the thin film transistors 1021 in the plurality of pixel units 102 and the second gate pattern c4 of the row drive circuit 105 included in the display panel are disposed in a first gate layer. In other words, the first gate pattern a4 and the second gate pattern c4 may be made of a same material by a same one-time patterning process. The source-drain electrodes a8 of the thin film transistors 1021 in the plurality of pixel units 102 and the connection layer c9 of the row drive circuit 105 included in the display panel are disposed in a source-drain electrode layer. In other words, the source-drain electrode a8 and the connection layer c9 may be made of a same material by a one-time patterning process. In addition, the third gate pattern c6 of the row drive circuit 105 may be disposed in a second gate layer.

The electrode patterns b1 of the light-emitting units 1022 in the plurality of pixel units 102 included in the display panel 10 are all disposed in an anode layer. In other words, the electrode patterns b1 of the light-emitting units 1022 in the plurality of pixel units 102 may be made of a same material by a one-time patterning process. The light-emitting patterns b2 of the light-emitting units 1022 in the plurality of pixel units 102 included in the display panel 10 are all disposed in a light-emitting layer. In other words, the light-emitting patterns b2 of the light-emitting units 1022 in the plurality of pixel units 102 may be made of a same material by a one-time patterning process.

Referring to FIG. 10, the display panel 10 includes a pixel define layer 106 and a support layer 107. The pixel define layer 106 may be disposed on a side of the anode layer distal from the base substrate, and the support layer 107 may be disposed on a side of the pixel define layer 106 distal from the base substrate. The pixel define layer 106 may be provided with a plurality of openings. Each of the plurality of openings may be configured to be exposed to one electrode pattern b1 in the anode layer, such that the light-emitting pattern b2 subsequently formed in the opening can be in contact with the electrode pattern b1. In this way, the pixel unit is capable of emitting light.

Referring to FIG. 10, it can be seen that the display panel 10 may further include a passivation layer (PVX) 110, a first planarization layer 108 and a second planarization layer 111. The passivation layer 110 may be disposed on a side of the source-drain electrode a8 distal from the base substrate 101. The second planarization layer 111 is disposed on a side of the passivation layer 110 distal from the base substrate 101. The at least one first power line 104 is disposed on a side of the second planarization layer 111 distal from the base substrate 101. The first planarization layer 108 is disposed on a side of the at least one first power line 104 distal from the base substrate 101. In other words, the passivation layer 110, the second planarization layer 111, the at least one first power line 104, and the first planarization layer 108 are sequentially laminated in the direction going away from the base substrate 101.

In the embodiment of the present disclosure, referring to FIG. 10, the orthographic projection of the second planarization layer 111 on the base substrate 101 may be overlapped with both the orthographic projection of the first barrier dam 1031 on the base substrate 101 and the orthographic projection of the second barrier dam 1032 on the base substrate 101.

Referring to FIG. 10, it can also be seen that the display panel 10 may further include a flexible film layer 112 and a barrier layer 113. The flexible film layer 112 may be disposed on a side of the base substrate 101, and the barrier layer 113 is disposed on a side of the flexible film layer 112 distal from the base substrate 101. In addition, both the flexible film layer 112 and the barrier layer 113 are disposed on a side of the plurality of pixel units 102 proximal to the base substrate 101.

In some embodiments, the material of the flexible film layer 112 may include polyimide (PI).

Figure 11:
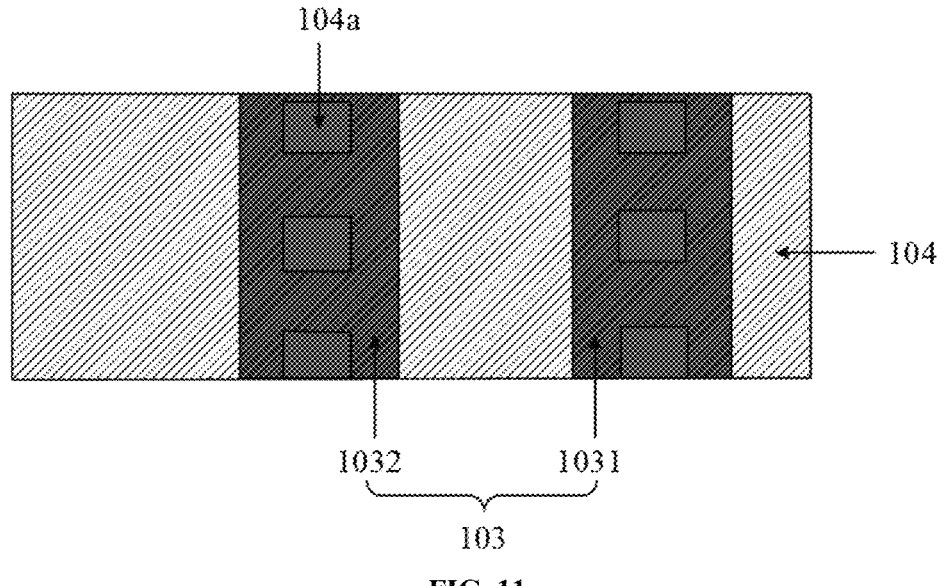
FIG. 11 is a schematic structural diagram of a first power line and a barrier structure according to an embodiment of the present disclosure.

FIG. 11 is a schematic structural diagram of a first power line and a barrier structure according to an embodiment of the present disclosure. Referring to FIG. 11, it can be seen that, a target part of the at least one first power line 104 may be provided with at least one opening 104a. The opening 104a may be exposed to the film layer on a side of the at least one first power line 104 proximal to the base substrate 101. The orthographic projection of the target part on the base substrate 101 may be overlapped with the orthographic projection of the barrier structure 103 on the base substrate 101. In other words, the target part is a part of the at least one first power line 104 that is overlapped with the barrier structure 103.

Bulge occurring to the display panel caused by the overflow of the organic layer in the display area 101a can be prevented by disposing at least one opening 104a in the target part of the first power line 104, such that the quality of the display panel is better.

Referring to FIGS. 1, 8 and 9, the display panel 10 may further include a power drive circuit 114. The power drive circuit 114 may be disposed in the peripheral area 101b and on a side of the first part 1041 distal from the barrier structure 103. For example, the power drive circuit 114 may be disposed in the first area 101b1 of the peripheral area 101b.

The power drive circuit 114 may be connected to the first part 1041 of the first power line 104, and is configured to provide a first power signal for the first power line 104, such that the first power line 104 provides the first power signal from the power drive circuit 114 can be provided to first electrode layers b3 of the plurality of pixel units 102 by the first power line 104. In addition, the power drive circuit 114 may also be connected to the second power line 109, and is configured to provide a second power signal for the second power line 109, such that the second power signal from the power drive circuit 114 can be provided to the plurality of pixel units 102 by the second power line 109.

In an exemplary embodiment, FIG. 8 shows a first power line 104 including two first parts 1041, and two second power lines 109. The power drive circuit 114 may be connected to the two first parts 1041 and the two second power lines 109.

Referring to FIGS. 7 and 10, the display panel 10 may further include an encapsulation film layer 115. The encapsulation film layer 115 may be disposed on a side of the plurality of pixel units 102 distal from the base substrate 101, and the encapsulation film layer 115 covers an area formed by the barrier structure 103 in a surrounding fashion. Referring to FIG. 10, the boundary of the area covered by the encapsulation film layer 115 may be disposed on a side of the barrier structure 103 distal from the plurality of pixel units 102.

In the embodiment of the present disclosure, the encapsulation film layer 115 may include a first film layer 1151, a second film layer 1152, and a third film layer 1153 which are laminated in the direction gong away from the base substrate 101.

In some embodiments, the first film layer 1151 and the third film layer 1153 may be made of an inorganic material, and the second film layer 1152 may be made of an organic material. For example, the first film layer 1151 and the third film layer 1153 may be made of one or more inorganic oxides such as silicon nitride (SiNx), silicon oxide (SiOx), and silicon oxynitride (SiOxNy). The second film layer 1152 may be made of a resin material. The resin may be a thermoplastic resin or a thermosetting resin. The thermoplastic resin may include a PMMA resin; and the thermosetting resin may include an epoxy resin.

It should be noted that the second film layer 1152 may be disposed in the area formed by the barrier structure 103 in a surrounding fashion. The first film layer 1151 and the third film layer 1153 may cover the area formed by the barrier structure 103 in a surrounding fashion and the barrier structure 103. That is, the orthographic projection of the barrier structure 103 on the base substrate 101 is disposed in the area covered by the encapsulation film layer 115. In this way, an effective of encapsulation of each structure disposed in the area formed by the barrier structure 103 in a surrounding fashion performed by the encapsulation film layer 115 can be ensured.

In the embodiment of the present disclosure, the second film layer 1152 may be manufactured by ink jet printing (IR). The first film layer 1151 and the third film layer 1153 may be manufactured by chemical vapor deposition (CVD).

Figure 12:
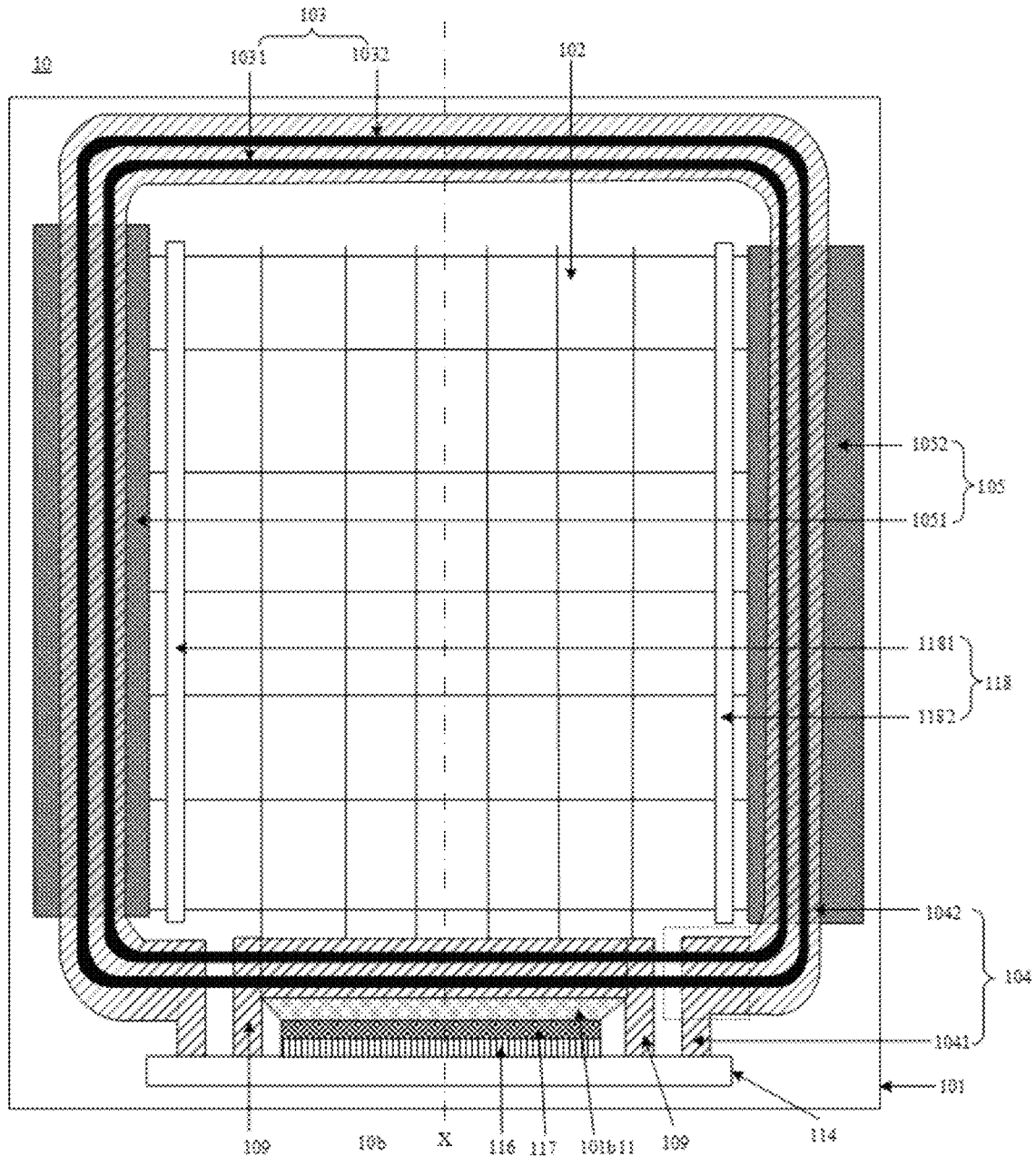
FIG. 12 is a schematic structural diagram of still another display panel according to an embodiment of the present disclosure.

FIG. 12 is a schematic structural diagram of still another display panel according to an embodiment of the present disclosure. Referring to FIG. 12, it can be seen that the display panel 10 may further include a drive integrated circuit 116 and a cell test circuit 117. The drive integrated circuit 116 and the cell test circuit 117 may be disposed in the first area 101b1 of the peripheral area 101b, and the drive integrated circuit 116 is distal from the display area 101a relative to the cell test circuit 117. In addition, the first area 101b1 of the base substrate 101 may include a fanout bonding area 101b11. The drive integrated circuit 116 and the cell test circuit 117 may be connected to a plurality of pixel units 102 via the fanout bonding area 101b11.

In addition, the display panel 10 may further include a reset circuit 118. The reset circuit 118 may include a first reset sub-circuit 1181 and a second reset sub-circuit 1182. The first reset sub-circuit 1181 is disposed in a third area 101b3 of the peripheral area 101b. The second reset sub-circuit 1182 is disposed in a fourth area 101b4 of the peripheral area 101b. Furthermore, the first reset sub-circuit 1181 is disposed on a side of a first drive sub-circuit 1051 of the row drive circuit 105 proximal to the plurality of pixel units 102, and the orthographic projection of the first reset sub-circuit 1181 on the base substrate 101 may be not overlapped with the orthographic projection of the first drive sub-circuit 1051 on the base substrate 101. The second reset sub-circuit 1182 is disposed on a side of the second drive sub-circuit 1052 of the row drive circuit 105 proximal to the plurality of pixel units 102, and the orthographic projection of the second reset sub-circuit 1182 on the base substrate 101 may be not overlapped with the orthographic projection of the second drive sub-circuit 1052 on the base substrate 101.

The first reset sub-circuit 1181 may also be disposed on a side of the first drive sub-circuit 1051 distal from the plurality of pixel units 102; and the second reset sub-circuit 1182 may also be disposed on a side of the second drive sub-circuit 1052 distal from the plurality of pixel units 102. The relative positions of the reset circuit 118 and the row drive circuit 105 are not limited in the embodiments of the present disclosure.

In summary, the embodiments of the present disclosure provide the display panel. Each two of the barrier structure, the at least one first power line, and the row drive circuit which are included in the display panel are partially overlapped with each other. In this way, the total width of each structure disposed in the peripheral area can be effectively reduced, such that the width of a frame of the display panel is reduced, which achieves a display panel with a narrow frame.

Figure 13:
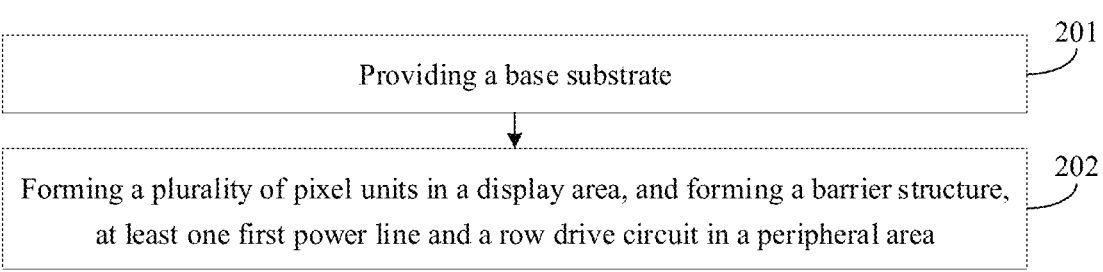
FIG. 13 is a flow chart of a method for manufacturing a display panel according to an embodiment of the present disclosure.

FIG. 13 is a flow chart of a method for manufacturing a display panel according to an embodiment of the present disclosure. The method may be configured to manufacture the display panel 10 according to any of the above embodiments. Referring to FIG. 13, the method may include the following processes.

In 201, a base substrate is provided.

In this embodiment, prior to manufacturing the display panel, a base substrate 101 may be acquired first. The base substrate 101 may be a glass substrate or a flexible substrate. The base substrate 101 may include a display area 101a and a peripheral area 101b surrounding the display area 101a.

In 202, a plurality of pixel units are formed in the display area, and a barrier structure, at least one first power line and a row drive circuit are formed in the peripheral area.

In the embodiment of the present disclosure, the formed barrier structure 103 may surround the plurality of pixel units 102. The at least one first power line 104 may include a first part 1041 and a second part 1042. The first part 1041 may be disposed on a side of the barrier structure 103 distal from the plurality of pixel units 102, and is configured to receive a first power signal. The second part 1042 may surround the plurality of pixel units 102, and may be connected to the first part 1041 and first electrode layers b3 in the plurality of pixel units 102, respectively. The row drive circuit 105 may be connected to the plurality of pixel units 102, and is configured to provide a drive signal for the plurality of pixel units 102.

It should be noted that in 202, the row drive circuit 105 may be formed on the base substrate 101, and then the at least one first power line 104 is formed on a side of the row drive circuit 105 distal from the base substrate 101. Afterwards, the barrier structure 103 is formed on a side of the first power line 104 distal from the base substrate 101.

The row drive circuit 105 may be formed in the process of forming the thin film transistor 1021 in the pixel unit 102. The at least one first power line 104 may be formed in the case that the thin film transistor 1021 in the pixel unit 102 is formed. The barrier structure 103 may be formed in the process of forming the second planarization layer 111, the pixel define layer 106 and the support layer 107.

In the embodiment of the present disclosure, orthographic projections of any two of the following structures on the base substrate 101 are at least partially overlapped with each other: the barrier structure 103, the at least one first power line 104, and the row drive circuit 105. In other words, the orthographic projection of the barrier structure 103 on the base substrate 101 is at least partially overlapped with the orthographic projection of the at least one first power line 104 on the base substrate 101; the orthographic projection of the barrier structure 103 on the base substrate 101 is at least partially overlapped with the orthographic projection of the row drive circuit 105 on the base substrate 101; and the orthographic projection of the at least one first power line 104 on the base substrate 101 is at least partially overlapped with the orthographic projection of the row drive circuit 105 on the base substrate 101.

In summary, the embodiments of the present disclosure provide a method for manufacturing the display panel. Each two of the barrier structure, the at least one first power line and the row drive circuit which are included in the display panel manufactured by this method are partially overlapped with each other. In this way, the total width of each structure disposed in the peripheral area can be effectively reduced, such that the width of a frame of the display panel is reduced, which achieves a display panel with a narrow frame.

Figure 14:
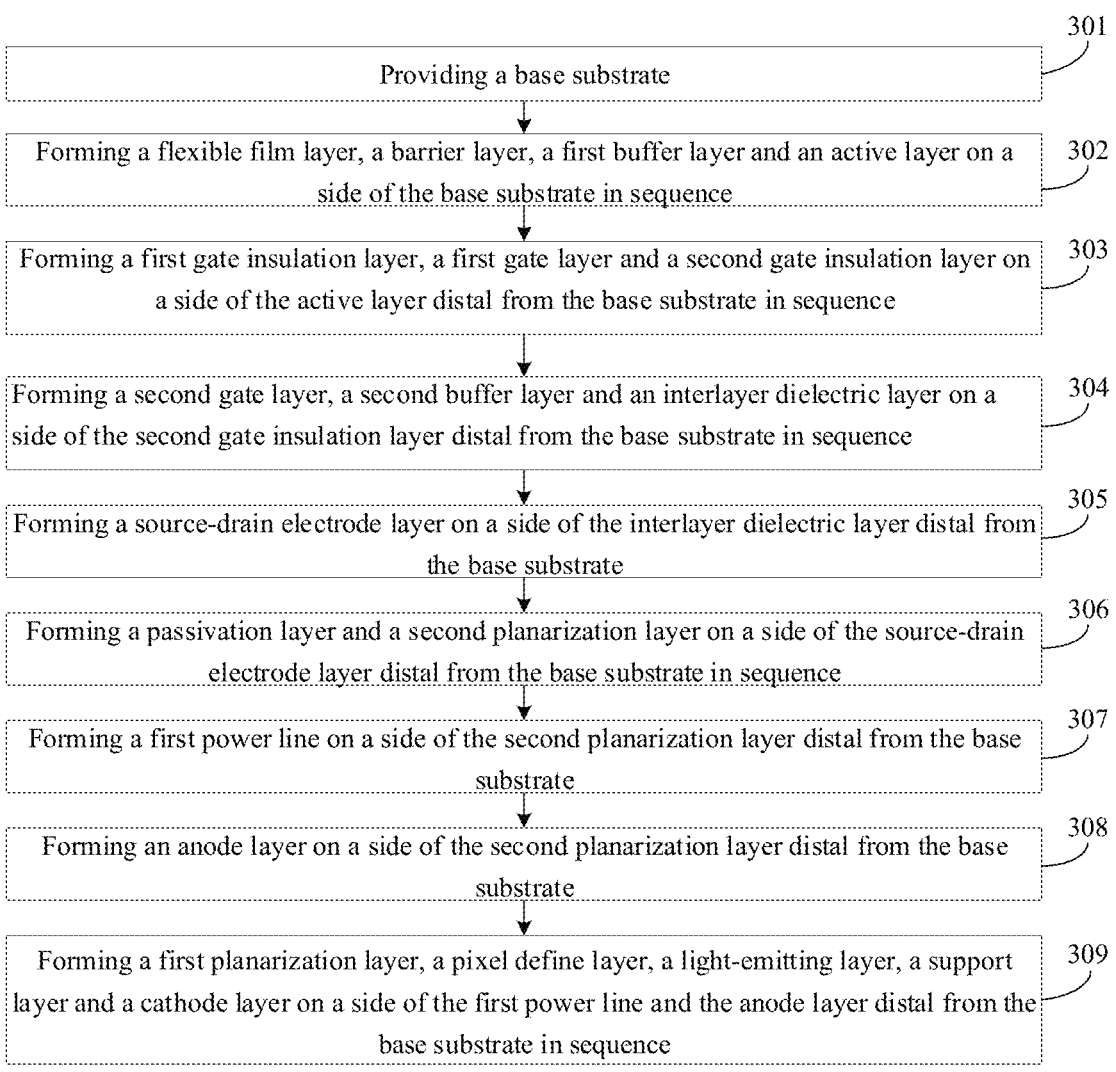
FIG. 14 is a flow chart of another method for manufacturing a display panel according to an embodiment of the present disclosure.

FIG. 14 is a flow chart of another method for manufacturing a display panel according to an embodiment of the present disclosure. The method may be configured to manufacture the display panel according to any of the above embodiments. Referring to FIG. 14, the method may include the following processes.

In 301, a base substrate is provided.

In this embodiment, prior to manufacturing the display panel, a base substrate 101 may be acquired first. The base substrate 101 may be a glass substrate or a flexible substrate. The base substrate 101 may include a display area 101a and a peripheral area 101b surrounding the display area 101a.

In 302, a flexible film layer, a barrier layer, a first buffer layer and an active layer are sequentially formed on a side of the base substrate.

Figure 15:
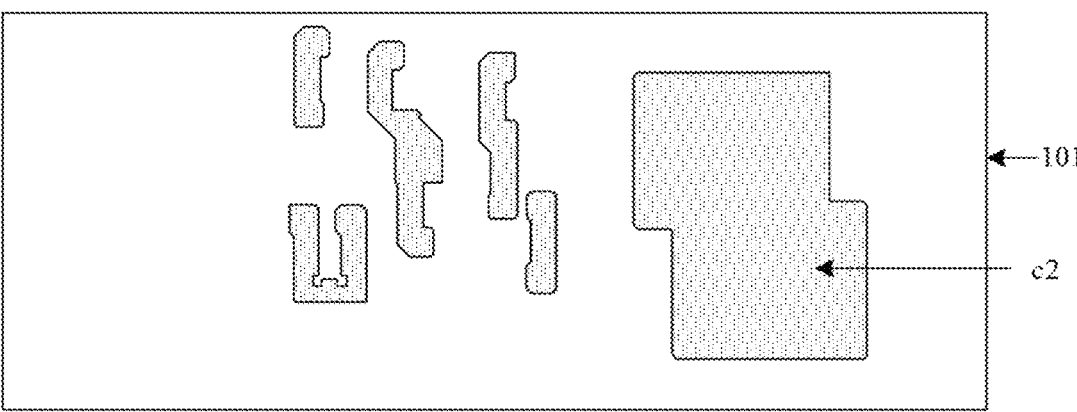
FIG. 15 is a schematic diagram of an active layer according to an embodiment of the present disclosure.

In the embodiment of the present disclosure, in the case that the base substrate 101 is acquired, the flexible film layer 112, the barrier layer 113, the first buffer layer, and the active layer may be sequentially formed on the base substrate 101. FIG. 15 is a schematic diagram of an active layer according to an embodiment of the present disclosure. Referring to FIG. 15, the active layer may include a plurality of patterns including a first active pattern a2 and a second active pattern c2. FIG. 15 is a schematic diagram of a partial area provided with a row drive circuit of a display panel, and thus, only the second active pattern c2 in the row drive circuit is shown.

It should be noted that all the flexible film layer 112, the barrier layer 113, and the first buffer layer may cover the entire surface of the base substrate 101, which is not shown in the accompanying drawings.

In 303, a first gate insulation layer, a first gate layer and a second gate insulation layer are sequentially formed on a side of the active layer distal from the base substrate.

In the embodiment of the present disclosure, in the case that the active layer is formed, the first gate insulation layer, the first gate layer, and the second gate insulation layer may be sequentially formed on a side of the base substrate 101.

Figure 16:
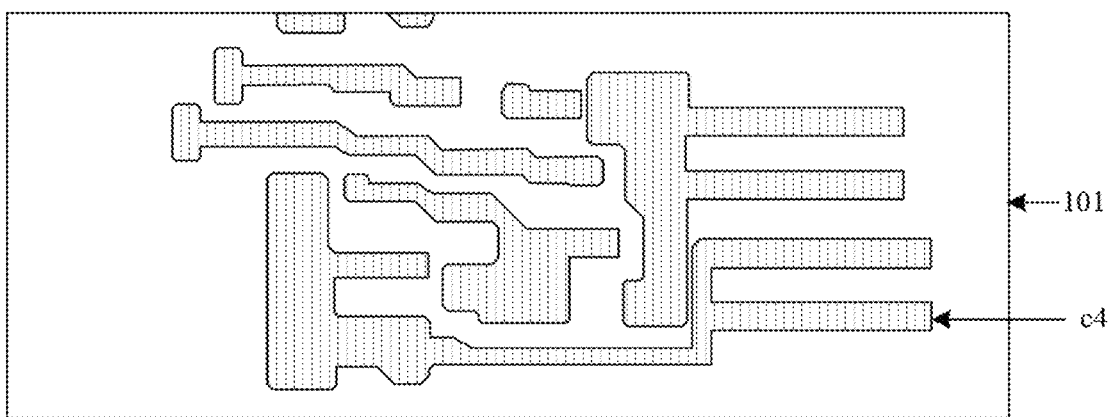
FIG. 16 is a schematic diagram of a first gate layer according to an embodiment of the present disclosure.
Figure 17:
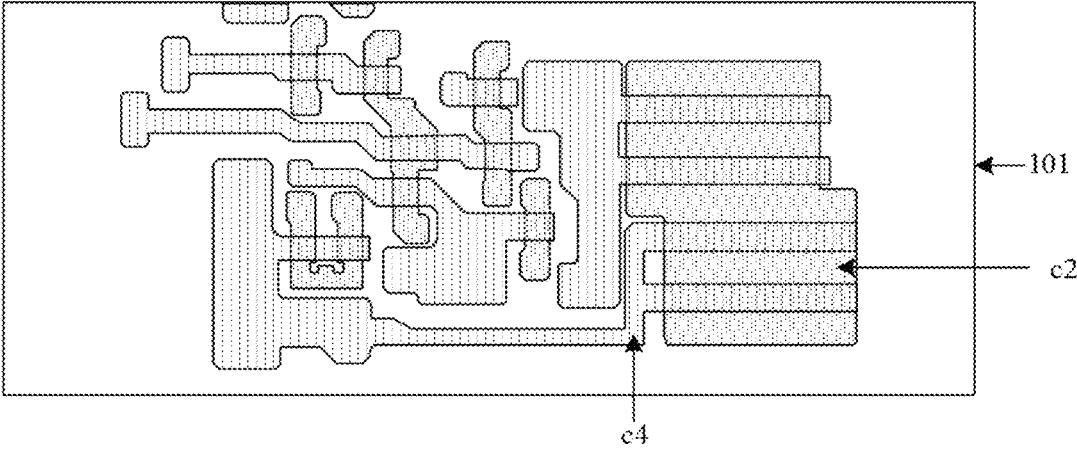
FIG. 17 is a schematic diagram of forming a first gate layer according to an embodiment of the present disclosure.

FIG. 16 is a schematic diagram of a first gate layer according to an embodiment of the present disclosure. FIG. 17 is a schematic diagram of forming the first gate layer according to an embodiment of the present disclosure. The first gate layer may include a plurality of patterns. The plurality of patterns include a first gate pattern a4 and a second gate pattern c4. FIGS. 16 and 17 show schematic diagrams of a partial area provided with a row drive circuit of a display panel, and thus, only the second gate pattern c4 in the row drive circuit is shown.

In addition, referring to FIG. 17, orthographic projections of the patterns in the active layer on the base substrate 101 may be overlapped with orthographic projections of the patterns in the first gate layer on the base substrate 101.

It should be noted that both the first gate insulation layer and the second gate insulation layer may cover the entire surface of the base substrate 101, which is not shown in FIGS. 16 and 17.

In 304, a second gate layer, a second buffer layer, and an interlayer dielectric layer are sequentially formed on a side of the second gate insulation layer distal from the base substrate.

In the embodiment of the present disclosure, in the case that the second gate insulation layer is formed, the second gate layer, the second buffer layer, and the interlayer dielectric layer may be sequentially formed on a side of the base substrate 101.

Figure 18:
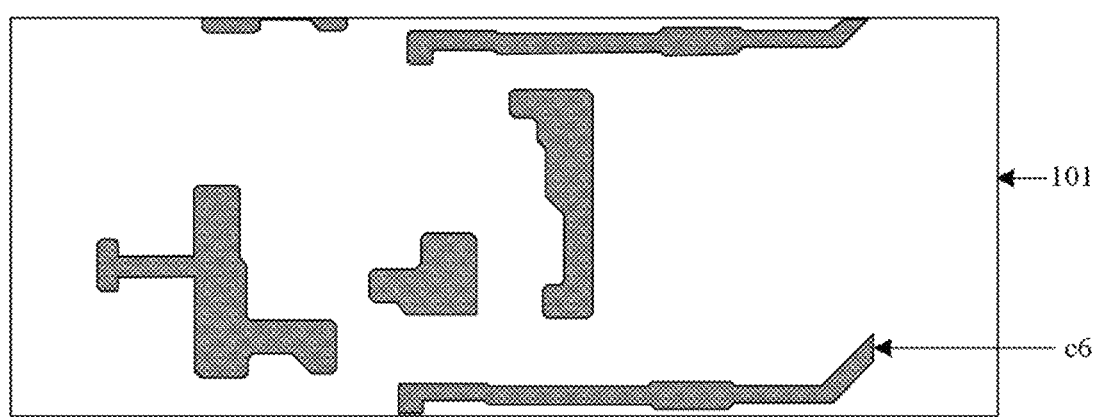
FIG. 18 is a schematic diagram of a second gate layer according to an embodiment of the present disclosure.
Figure 19:
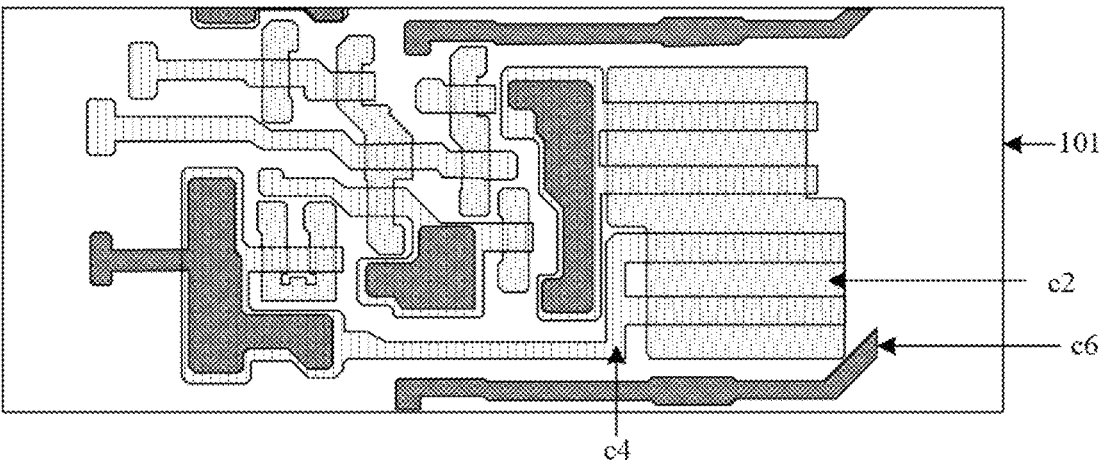
FIG. 19 is a schematic diagram of forming a second gate layer according to an embodiment of the present disclosure.

FIG. 18 is a schematic diagram of a second gate layer according to an embodiment of the present disclosure. FIG. 19 is a schematic diagram of forming the second gate layer according to an embodiment of the present disclosure. The second gate layer may include a plurality of patterns including a third gate pattern c6.

Referring to FIGS. 18 and 19, the orthographic projections of the patterns in the second gate layer on the base substrate 101 may be overlapped with the orthographic projections of the patterns in the first gate layer on the base substrate 101. In addition, the orthographic projections of the patterns in the second gate layer on the base substrate 101 may be overlapped with the orthographic projections of the patterns in the active layer on the base substrate 101.

Figure 20:
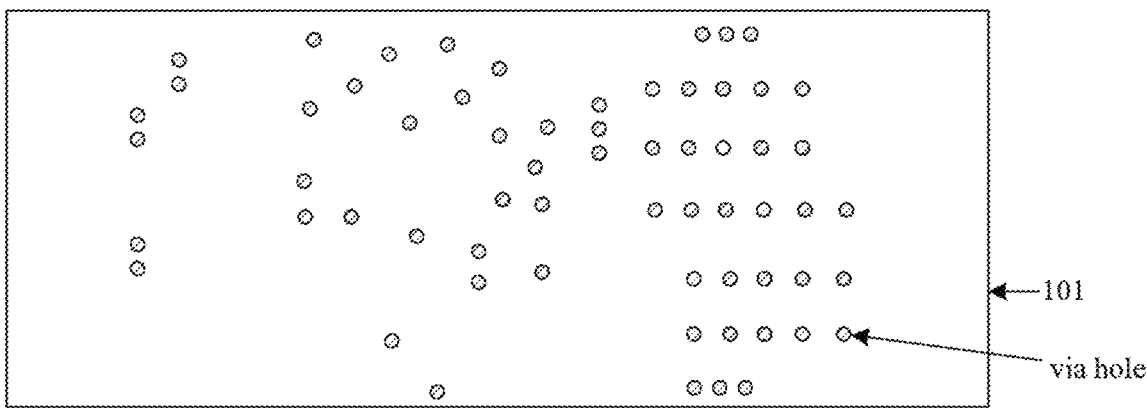
FIG. 20 is a schematic diagram of an interlayer dielectric layer according to an embodiment of the present disclosure.
Figure 21:
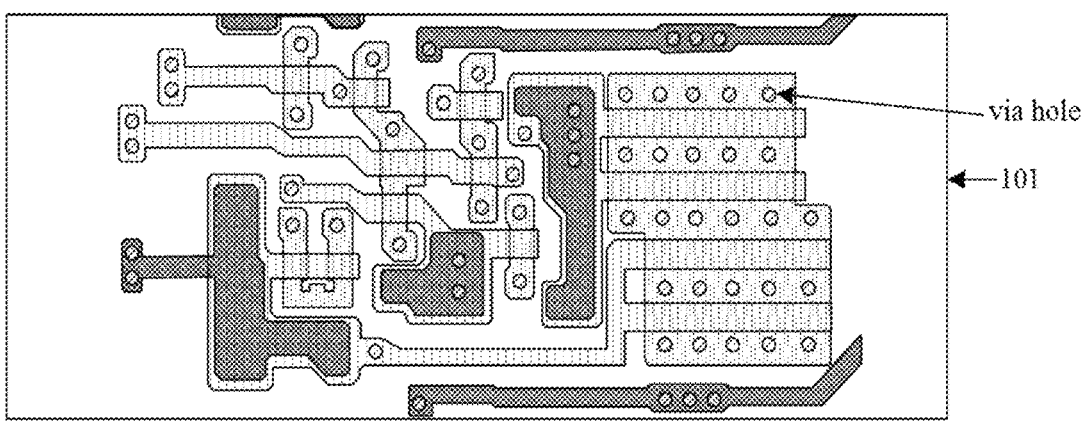
FIG. 21 is a schematic diagram of forming an interlayer dielectric layer according to an embodiment of the present disclosure.

FIG. 20 is a schematic diagram of an interlayer dielectric layer according to an embodiment of the present disclosure. FIG. 21 is a schematic diagram of forming an interlayer dielectric layer according to an embodiment of the present disclosure. Referring to FIGS. 20 and 21, the interlayer dielectric layer may be provided with a plurality of via holes. In addition, in order to show each via hole in the interlayer dielectric layer conveniently, the via holes are represented by filled patterns in FIGS. 20 and 21. Other areas without filled patterns of the interlayer dielectric layer are configured to indicate that solid materials are provided in these areas.

It should be noted that a shape of the second buffer layer may be the same as a shape of the interlayer dielectric layer, which is not repeated in the embodiments of the present disclosure herein. In addition, the interlayer dielectric layer, the second buffer layer, the second gate insulation layer and the first gate insulation layer may be provided with a first via hole. The interlayer dielectric layer, the second buffer layer, and the second gate insulation layer may be provided with a second via hole. The first via holes may be configured to achieve a connection between the source-drain electrode formed on a side of the interlayer dielectric layer distal from the base substrate and the active layer. The second via holes may be configured to realize a connection between the connection layer formed on a side of the interlayer dielectric layer distal from the base substrate and the second gate pattern in the first gate layer.

In 305, a source-drain electrode layer is formed on a side of the interlayer dielectric layer distal from the base substrate.

In the embodiment of the present disclosure, in the case that the interlayer dielectric layer is formed, the source-drain electrode layer may be formed on a side of the interlayer dielectric layer distal from the base substrate. The source-drain electrode layer includes a source-drain electrode and a connection layer c9. The source-drain electrode includes a source electrode and a drain electrode which are spaced apart from each other. The source electrode and the drain electrode may be connected to the active layer via the first via hole, respectively. The connection layer c9 may be connected to the second gate pattern in the first gate layer via the second via hole.

Figure 22:
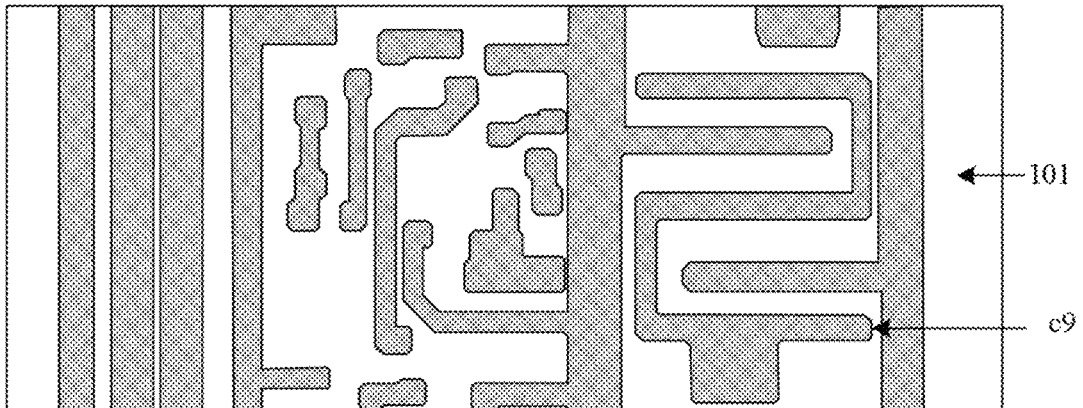
FIG. 22 is a schematic diagram of a source-drain electrode layer according to an embodiment of the present disclosure.
Figure 23:
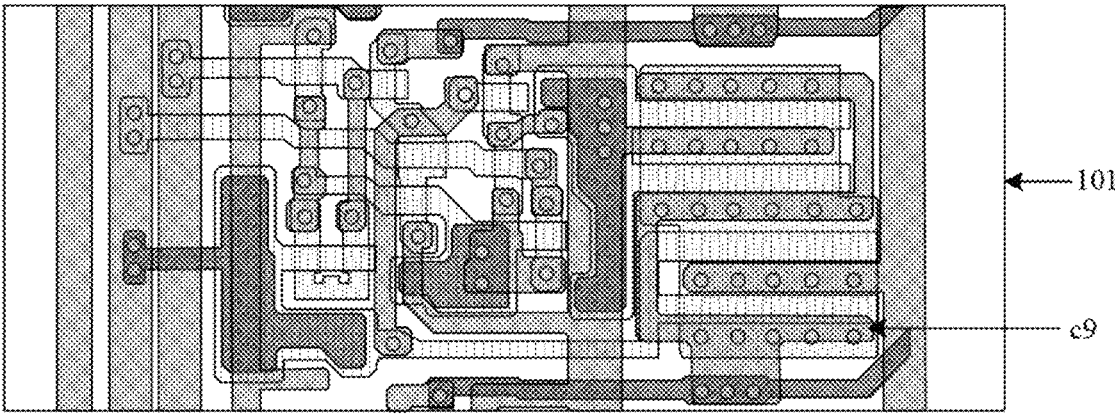
FIG. 23 is a schematic diagram of forming a source-drain electrode layer according to an embodiment of the present disclosure.

FIGS. 22 and 23 show schematic diagrams of a partial area provided with a row drive circuit of a display panel. Only the connection layer c9 included in the row drive circuit is shown in FIGS. 22 and 23.

In 306, a passivation layer and a second planarization layer are sequentially formed on a side of the source-drain electrode layer distal from the base substrate.

Figure 24:
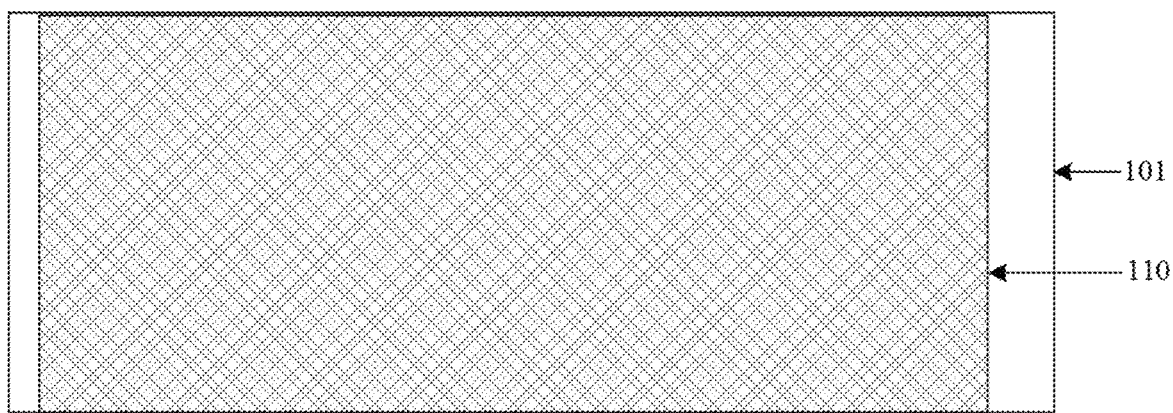
FIG. 24 is a schematic diagram of a passivation layer according to an embodiment of the present disclosure.
Figure 25:
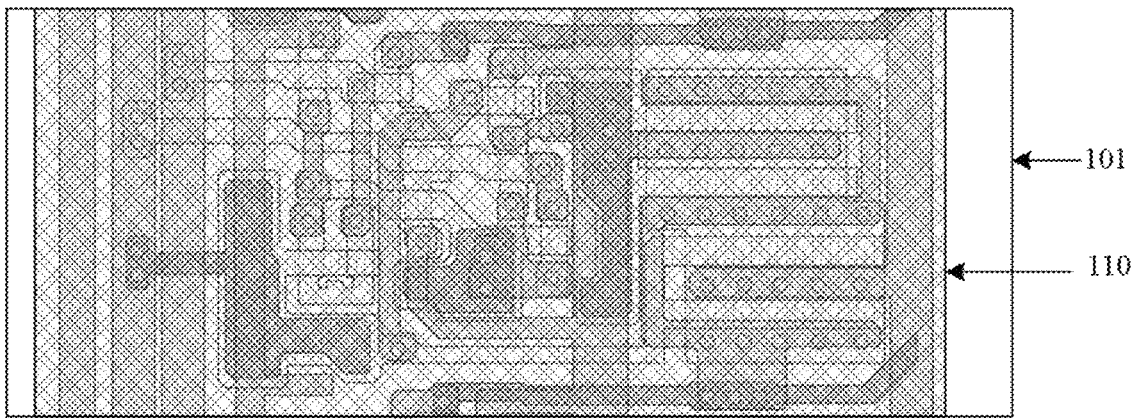
FIG. 25 is a schematic diagram of forming a passivation layer according to an embodiment of the present disclosure.

In the embodiment of the present disclosure, referring to FIGS. 24 and 25, a passivation layer 110 may be formed on a side of the source-drain electrode layer distal from the base substrate. In addition, a second planarization layer 111 may be formed on a side of the passivation layer 110 distal from the base substrate.

The passivation layer 110 and the second planarization layer 111 may be provided with a third via hole (not shown in the figure). The third via hole may be configured to realize a connection between an electrode pattern of the anode layer formed on a side of the second planarization layer 111 distal from the base substrate and the drain electrode.

In addition, filled patterns are configured to indicate areas without solid materials in the passivation layer in FIGS. 24 and 25. Other areas of the passivation layer without the filled patterns are configured to indicate that solid materials are provided in these areas. In addition, the second planarization layer is formed in each of the partial areas of the row drive circuit shown in FIG. 25, and thus the second planarization layer is not illustrated alone in the accompanying drawings.

In 307, a first power line is formed on a side of the second planarization layer distal from the base substrate.

Figure 26:
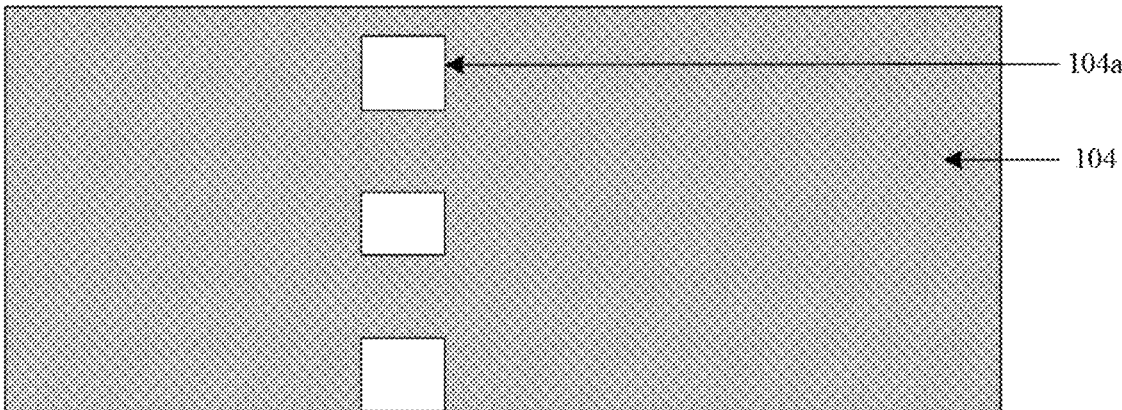
FIG. 26 is a schematic diagram of a first power line according to an embodiment of the present disclosure.
Figure 27:
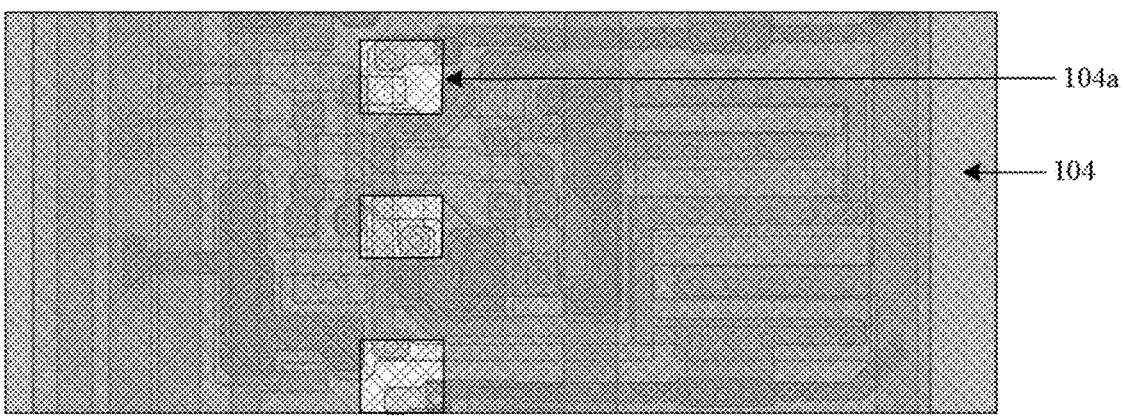
FIG. 27 is a schematic diagram of forming a first power line according to an embodiment of the present disclosure.

In the embodiments of the present disclosure, referring to FIGS. 26 and 27, the first power line 104 may be formed on a side of the second planarization layer distal from the base substrate. The first power line 104 may be provided with at least one opening 104a. Each opening 104a may be configured to be exposed to a film layer on a side of the first power line 104 proximal to the base substrate 101. In addition, the opening 104a may be disposed in an area where the barrier structure 103 is formed.

In an exemplary embodiment, three openings 104a are shown in FIGS. 26 and 27, and the three openings 104a are all disposed in an area where the second barrier dam 1032 of the barrier structure 103 is formed. The opening 104a in the first power line 104 may also be disposed in an area where the first barrier dam 1031 of the barrier structure 103 is formed, which is not limited in the embodiments of the present disclosure.

In 308, an anode layer is formed on a side of the second planarization layer distal from the base substrate.

In the embodiments of the present disclosure, the anode layer may be formed on a side of the second planarization layer distal from the base substrate. The anode layer may include electrode patterns of a plurality of light-emitting units. Each of the electrode patterns may be connected to the drain electrode via the second planarization layer and the third via hole in the passivation layer.

In 309, a first planarization layer, a pixel define layer, a light-emitting layer, a support layer, and a first electrode layer are sequentially formed on a side of the first power line and the anode layer distal from the base substrate.

Figure 28:
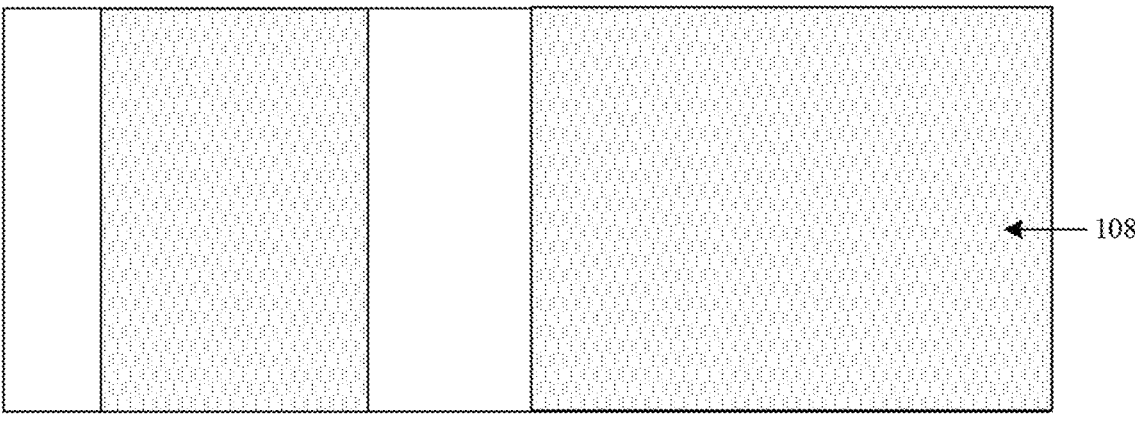
FIG. 28 is a schematic diagram of a first planarization layer according to an embodiment of the present disclosure.
Figure 29:
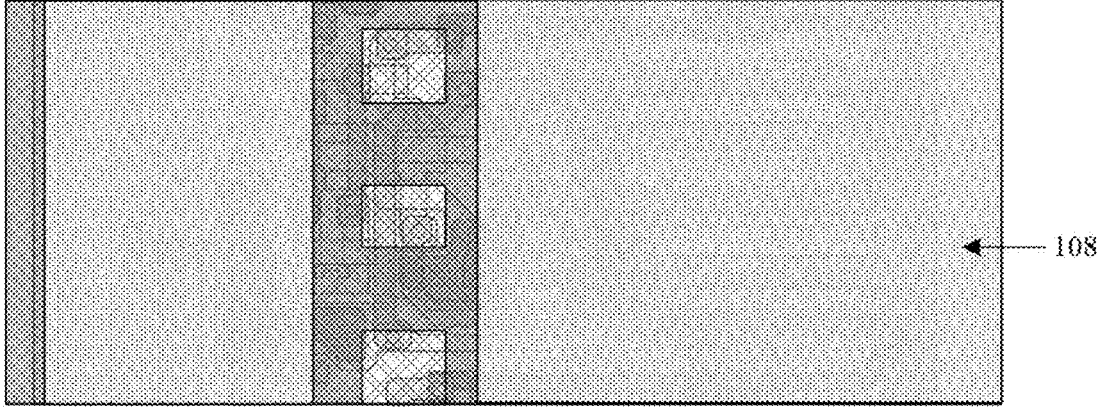
FIG. 29 is a schematic diagram of forming a first planarization layer according to an embodiment of the present disclosure.

In the embodiment of the present disclosure, referring to FIGS. 28 and 29, the first planarization layer 108 may be formed on a side of the base substrate 101. In addition, the third pattern 108a in the first planarization layer 108 may be disposed in an area where the second barrier dam 1032 in the barrier structure 103 is formed. In FIG. 28 and FIG. 29, filled patterns are configured to indicate areas without solid materials in the first planarization layer 108. Other areas without the filled patterns of the first planarization layer 108 are configured to indicate that solid materials are provided in these areas.

Figure 30:
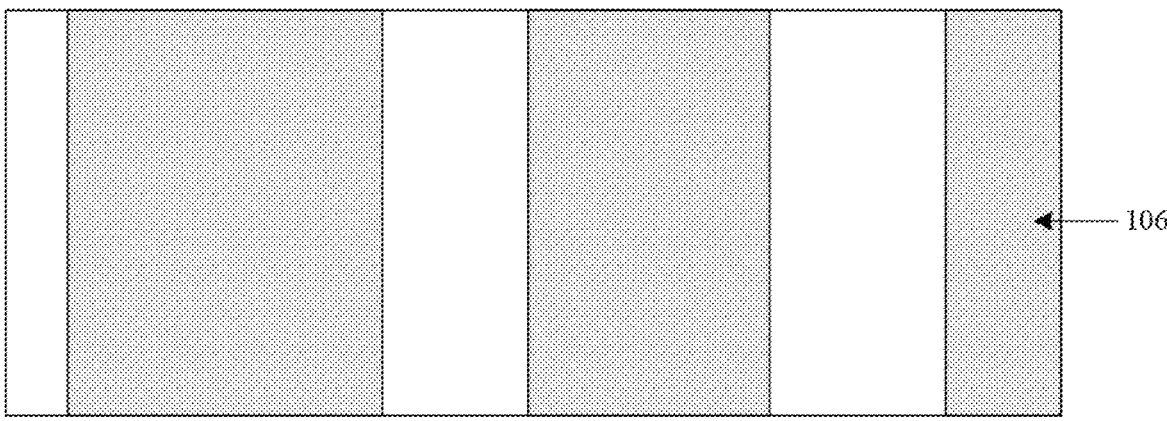
FIG. 30 is a schematic diagram of a pixel define layer according to an embodiment of the present disclosure.
Figure 31:
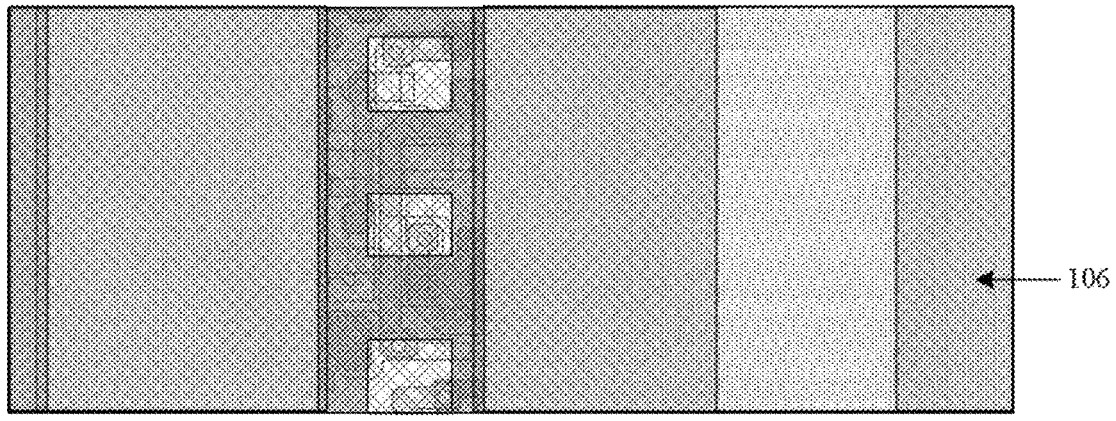
FIG. 31 is a schematic diagram of forming a pixel define layer according to an embodiment of the present disclosure.

Referring to FIGS. 30 and 31, a pixel define layer 106 may be formed on a side of the base substrate 101. The first pattern 106a in the pixel define layer 106 may be disposed in an area where the first barrier dam 1031 in the barrier structure 103 is formed. The fourth pattern 106*b* in the pixel define layer 106 may be disposed in an area where the second barrier dam 1032 in the barrier structure is formed. In FIGS. 30 and 31, filled patterns are configured to indicate areas without solid materials in the pixel define layer 106. Other areas without the filled patterns of the pixel define layer 106 are configured to indicate that solid materials are provided in these areas.

Figure 32:
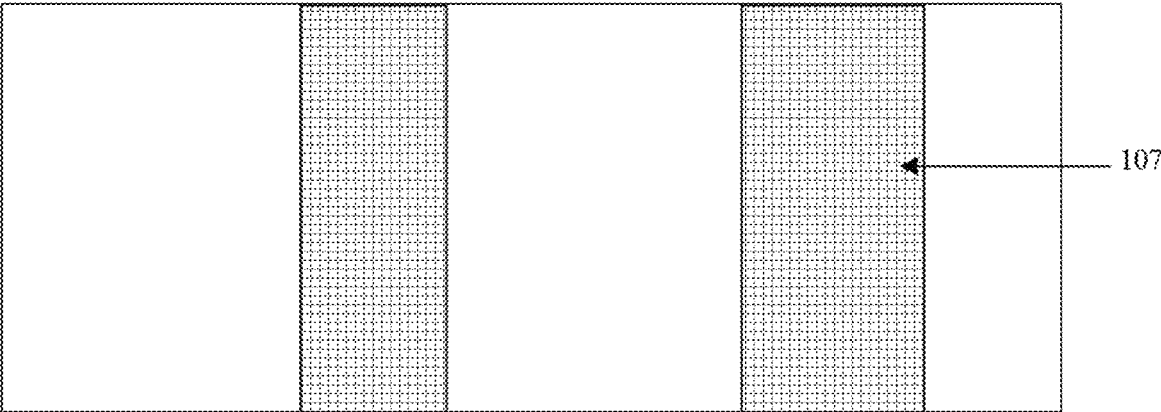
FIG. 32 is a schematic diagram of a support layer according to an embodiment of the present disclosure.
Figure 33:
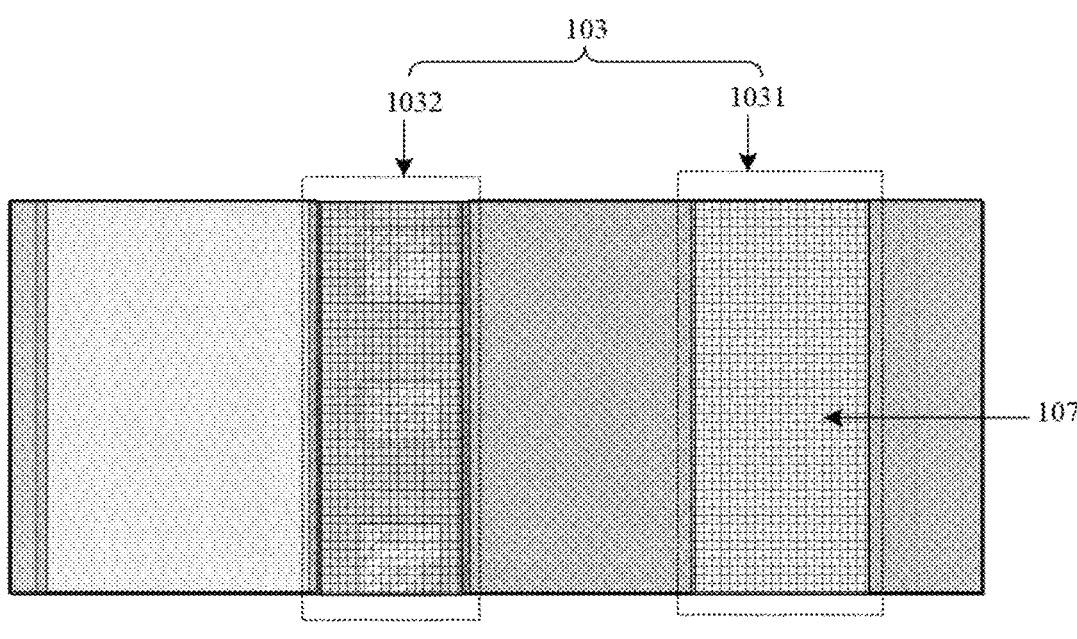
FIG. 33 is a schematic diagram of forming a support layer according to an embodiment of the present disclosure.

Referring to FIGS. 32 and 33, the support layer 107 may be formed on a side of the base substrate 101. The second pattern 107*a* in the support layer 107 may be disposed in an area where the first barrier dam 1031 in the barrier structure 103 is formed. The fifth pattern 107*b* in the support layer 107 may be disposed in an area where the second barrier dam 1032 in the barrier structure is formed. In FIGS. 32 and 33, filled patterns are configured to indicate areas provided with solid materials in the support layer 107. Other areas without the filled patterns of the support layer 107 are configured to indicate that solid materials are not provided in these areas.

In addition, a part of the pixel define layer 106 in the display area 101*a* may be provided with a plurality of openings. Each of the opening may be configured to be exposed to one electrode pattern b1 in the anode layer, such that the light-emitting pattern b2 of the light-emitting layer subsequently formed in each opening can be in contact with the electrode pattern b1. In this way, the pixel unit is capable of emitting light.

It should be noted that since both the light-emitting layer and the first electrode layer are disposed in the display area of the base substrate 101, which is not illustrated by the accompanying drawings.

In summary, the embodiments of the present disclosure provide a method for manufacturing a display panel. Each two of the barrier structure, the at least one first power line, and the row drive circuit which are included in the display panel manufactured by this method is partially overlapped with each other. In this way, the total width of each structure disposed in the peripheral area can be effectively reduced, such that the width of a frame of the display panel is reduced, which achieves a display panel with a narrow frame.

Figure 34:
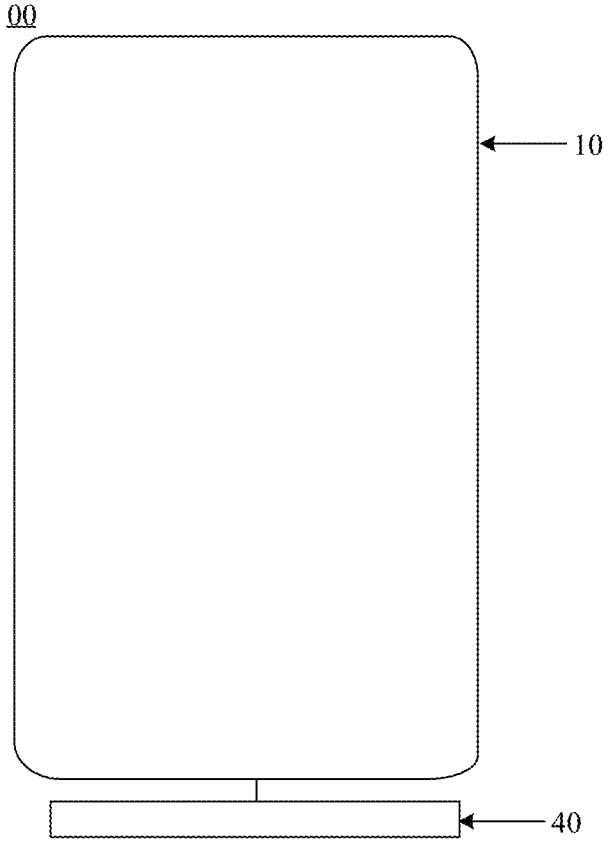
FIG. 34 is a schematic structural diagram of a display device according to an embodiment of the present disclosure.

FIG. 34 is a schematic structural diagram of a display device according to an embodiment of the present disclosure. Referring to FIG. 34, it can be seen that the display device 00 may include a power assembly 40 and the display panel 10 according to any of the above embodiments. The power assembly 40 may be configured to supply power to the display panel 10.

In some embodiments, the display device may be any product or component having a display function, such as an OLED display device, a liquid crystal display device, an electronic paper, a mobile phone, a tablet computer, a TV, a display, a notebook computer, a digital photo frame, or a navigator.

The foregoing descriptions are only optional embodiments of the present disclosure, and do not intend to limit the present disclosure. Any modification, equivalent replacement, improvement and the like within the spirit and principle of the present disclosure should be embraced by the protective scope of the present disclosure.

What is claimed is:

1. A display panel, comprising:
a base substrate, comprising a display area and a peripheral area surrounding the display area;
a plurality of pixel units, disposed in the display area;
a barrier structure, disposed in the peripheral area;

at least one first power line, disposed in the peripheral area and comprising a first part and a second part, wherein the first part is disposed on a side of the barrier structure distal from the plurality of pixel units and is configured to receive a first power signal, and the second part is electrically connected to the first part and first electrode layers in the plurality of pixel units respectively; and
a row drive circuit, disposed in the peripheral area, electrically connected to the plurality of pixel units and configured to provide a drive signal for the plurality of pixel units,
wherein orthographic projections of any two of the following structures on the base substrate are at least partially overlapped with each other: the barrier structure, the at least one first power line, and the row drive circuit;
the display panel further comprises: at least one second power line disposed in the peripheral area;
wherein one end of the at least one second power line is disposed on a side of the barrier structure distal from the plurality of pixel units, and is configured to receive a second power signal; and the other end of the at least one second power line is disposed on a side of the barrier structure proximal to the plurality of pixel units, and is electrically connected to the plurality of pixel units, and
an orthographic projection of the at least one second power line on the base substrate is at least partially overlapped with the orthographic projection of the barrier structure on the base substrate.

2. The display panel according to claim 1, wherein the peripheral area comprises: a first area and a second area which are opposite and parallel to each other, and a third area and a fourth area which are opposite and parallel to each other; an extension direction of the first area is perpendicular to an extension direction of the third area; and
the first part is disposed in the first area, and the second part is disposed in the second area, the third area and the fourth area.

3. The display panel according to claim 2, wherein the row drive circuit comprises a first drive sub-circuit and a second drive sub-circuit, the first drive sub-circuit is disposed in the third area, and the second drive sub-circuit is disposed in the fourth area.

4. The display panel according to claim 3, wherein both the first sub-drive circuit and the second sub-drive circuit comprise: a light-emitting control drive circuit, a first-type drive circuit and a second-type drive circuit, the light-emitting control drive circuit is configured to provide a light-emitting control signal, and both the first-type drive circuit and the second-type drive circuit are configured to provide a scanning signal; and
an orthographic projection of the first power line on the base substrate is at least partially overlapped with an orthographic projection of the light-emitting control drive circuit on the base substrate, and an orthographic projection of the barrier structure on the base substrate is at least partially overlapped with the orthographic projection of the light-emitting control drive circuit on the base substrate.

5. The display panel according to claim 1, wherein the barrier structure comprises a first barrier dam and a second barrier dam;

wherein the first barrier dam is proximal to the plurality of pixel units relative to the second barrier dam, and a thickness of the first barrier dam is less than a thickness of the second barrier dam.

6. The display panel according to claim 5, wherein the first barrier dam comprises a first pattern and a second pattern sequentially laminated in a direction going away from the base substrate; and the second barrier dam comprises a third pattern, a fourth pattern, and a fifth pattern sequentially laminated in a direction going away from the base substrate;

wherein the first pattern and the fourth pattern are disposed in a pixel define layer of the display panel, the second pattern and the fifth pattern are disposed in a support layer of the display panel, and the third pattern is disposed in a first planarization layer of the display panel.

7. The display panel according to claim 1, wherein the first power line comprises two first parts and one second part;

wherein the two first parts are disposed symmetrically with an axis of the base substrate, one end of the second part is connected to one of the two first parts, and the other end of the second part is connected to the other of the two first parts, wherein the axis is parallel to a column direction of the plurality of pixel units.

8. The display panel according to claim 1, wherein the second power line comprises a third part, two fourth parts, a fifth part, and two sixth parts; the third part is disposed on a side of the barrier structure proximal to the plurality of pixel units and electrically connected to the plurality of pixel units; the two fourth parts are disposed on a side of the third part distal from the plurality of pixel units and electrically connected to the third part; the fifth part is disposed on a side of the two fourth parts distal from the plurality of pixel units and electrically connected to the two fourth parts; and the two sixth parts are disposed on a side of the barrier structure distal from the plurality of pixel units, are configured to receive the second power signals, and are electrically connected to the fifth part, wherein the two fourth parts are disposed symmetrically with the axis of the base substrate, the two sixth parts are disposed symmetrically with the axis of the base substrate, and the axis is parallel to the column direction of the plurality of pixel units.

9. The display panel according to claim 8, wherein the first power line comprises two first parts disposed symmetrically with the axis; and a distance between the sixth part and the first part on a same side of the axis is less than a distance between the sixth part and the axis.

10. The display panel according to claim 8, wherein both the third part and the fifth part extend along a row direction, and the two fourth parts and the two sixth parts extend along a column direction.

11. The display panel according to claim 8, wherein an orthographic projection of each of the fourth parts on the base substrate is at least partially overlapped with the orthographic projection of the barrier structure on the base substrate.

12. The display panel according to claim 1, wherein each of the plurality of pixel units comprises a thin film transistor and a light-emitting unit sequentially laminated in a direction going away from the base substrate;

the thin film transistor comprises a first buffer layer, a first active pattern, a first gate insulation layer, a first gate pattern, a second gate insulation layer, a second buffer layer, an interlayer dielectric layer, and a source-drain electrode sequentially laminated in a direction going away from the base substrate, wherein the source-drain electrode comprises a source electrode and a drain electrode spaced apart from each other, and are both electrically connected to the first active pattern; and the light-emitting unit comprises an electrode pattern, a light-emitting pattern, and a first electrode layer sequentially laminated in a direction going away from the base substrate, wherein the electrode pattern is electrically connected to the drain electrode.

13. The display panel according to claim 12, wherein the row drive circuit comprises the first buffer layer, a second active pattern, the first gate insulation layer, a second gate pattern, the second gate insulation layer, a third gate pattern, the second buffer layer, the interlayer dielectric layer, and a connection layer sequentially laminated in a direction going away from the base substrate; and the connection layer is electrically connected to the first gate pattern, wherein the first active pattern and the second active pattern are disposed in a same layer, the first gate pattern and the second gate pattern are disposed in a same layer, and the source-drain electrode and the connection layer are disposed in a same layer.

14. The display panel according to claim 13, further comprising: a passivation layer, a first planarization layer and a second planarization layer, wherein the passivation layer is disposed on a side of the source-drain electrode distal from the base substrate, the second planarization layer is disposed on a side of the passivation layer distal from the base substrate, the at least one first power line is disposed on a side of the second planarization layer distal from the base substrate, and the first planarization layer is disposed on a side of the at least one first power line distal from the base substrate.

15. The display panel according to claim 1, wherein a target part of the at least one first power line is provided with at least one opening, wherein an orthographic projection of the target part on the base substrate is overlapped with the orthographic projection of the barrier structure on the base substrate.

16. The display panel according to claim 1, further comprising: a power drive circuit disposed in the peripheral area and on a side of the first part distal from the barrier structure; and the power drive circuit is electrically connected to the first part and configured to provide the first power signal for the at least one first power line.

17. The display panel according to claim 1, further comprising: an encapsulation film layer disposed on a side of the pixel units distal from the base substrate and covering an area which is formed by the barrier structure in a surrounding fashion.

18. A method for manufacturing a display panel, the method comprising:

providing a base substrate, wherein the base substrate comprises a display area and a peripheral area surrounding the display area; and forming a plurality of pixel units in the display area, and forming a barrier structure, at least one first power line, at least one second power line and a row drive circuit in the peripheral area, wherein the at least one first power line comprises a first part and a second part, the first part is disposed on a side of the barrier structure distal from the plurality of pixel units and configured to receive a first power signal, the second part is electrically connected to the first part and first electrode layers in the plurality of pixel units respectively, the row drive circuit is electrically connected to the plurality of pixel units and configured to provide a drive signal for the plurality of pixel units, and orthographic projections of any two of the following structures on the base substrate are at least partially overlapped with each other: the barrier structure, the at least one first power line, and the row drive circuit;

wherein one end of the at least one second power line is disposed on a side of the barrier structure distal from the plurality of pixel units, and is configured to receive a second power signal; and the other end of the at least one second power line is disposed on a side of the barrier structure proximal to the plurality of pixel units, and is electrically connected to the plurality of pixel units, and an orthographic projection of the at least one second power line on the base substrate is at least partially overlapped with the orthographic projection of the barrier structure on the base substrate.

19. A display device, comprising: a power assembly and the display panel as defined by claim 1, wherein the power assembly is configured to supply power to the display panel.

\* \* \* \* \*